United States Patent
Reynolds et al.

(10) Patent No.: US 10,338,162 B2
(45) Date of Patent: Jul. 2, 2019

(54) AC VECTOR MAGNETIC ANOMALY DETECTION WITH DIAMOND NITROGEN VACANCIES

(71) Applicant: Lockheed Martin Corporation, Bethesda, MD (US)

(72) Inventors: Colleen Mary Reynolds, Philadelphia, PA (US); David Nelson Coar, Cherry Hill, NJ (US); Mary Catherine Chih-Li Decristoforo, Mount Laurel, NJ (US); Laird Nicholas Egan, Philadelphia, PA (US); Jon C. Russo, Cherry Hill, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 501 days.

(21) Appl. No.: 15/003,670

(22) Filed: Jan. 21, 2016

(65) Prior Publication Data
US 2017/0212190 A1 Jul. 27, 2017

(51) Int. Cl.
*G01R 33/26* (2006.01)

(52) U.S. Cl.
CPC .................................. *G01R 33/26* (2013.01)

(58) Field of Classification Search
CPC ...... G01R 33/26; G01R 33/24; G01R 33/032; G01N 24/006
See application file for complete search history.

(56) References Cited

U.S. PATENT DOCUMENTS

| 2,746,027 | A | 5/1956 | Murray |
| 3,359,812 | A | 12/1967 | Everitt |
| 3,389,333 | A | 6/1968 | Wolff et al. |

(Continued)

FOREIGN PATENT DOCUMENTS

| CN | 105738845 A | 7/2016 |
| CN | 106257602 | 12/2016 |

(Continued)

OTHER PUBLICATIONS

U.S. Appl. No. 14/659,498, filed Mar. 16, 2015.
(Continued)

*Primary Examiner* — Patrick Assouad
*Assistant Examiner* — Demetrius R Pretlow
(74) *Attorney, Agent, or Firm* — Foley & Lardner LLP

(57) ABSTRACT

A system for magnetic anomaly detection is described. The system may include a nitrogen vacancy (NV) diamond material comprising a plurality of NV centers. A controller modulates a first code packet and controls a first magnetic field generator to apply a first time varying magnetic field at the NV diamond material based on the modulated first code packet. The controller modulates a second code packet and control a second magnetic field generator to apply a second time varying magnetic field at the NV diamond material based on the modulated second code packet, wherein the first code packet and the second code packet are binary sequences which have a low cross correlation with each other. The controller determines a magnitude and direction of the magnetic field at the NV diamond material, and determines a magnetic vector anomaly based on the determined magnitude and direction of the magnetic field.

44 Claims, 6 Drawing Sheets

(56) References Cited

U.S. PATENT DOCUMENTS

| | | |
|---|---|---|
| 3,490,032 A | 1/1970 | Zurflueh |
| 3,514,723 A | 5/1970 | Cutler |
| 3,518,531 A | 6/1970 | Huggett |
| 3,621,380 A | 11/1971 | Barlow, Jr. |
| 3,745,452 A | 7/1973 | Osburn et al. |
| 3,899,758 A | 8/1975 | Maier et al. |
| 4,025,873 A | 5/1977 | Chilluffo |
| 4,047,805 A | 9/1977 | Sekimura |
| 4,078,247 A | 3/1978 | Albrecht |
| 4,084,215 A | 4/1978 | Willenbrock |
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 4,982,158 A | 1/1991 | Nakata et al. |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,210,650 A | 5/1993 | O'Brien et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,894,220 A | 4/1999 | Wellstood et al. |
| 5,907,420 A | 5/1999 | Chraplyvy et al. |
| 5,907,907 A | 6/1999 | Ohtomo et al. |
| 5,915,061 A | 6/1999 | Vanoli |
| 5,995,696 A | 11/1999 | Miyagi et al. |
| 6,042,249 A | 3/2000 | Spangenberg |
| 6,057,684 A | 5/2000 | Murakami et al. |
| 6,064,210 A | 5/2000 | Sinclair |
| 6,121,053 A | 9/2000 | Kolber et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,215,303 B1 | 4/2001 | Weinstock et al. |
| 6,262,574 B1 | 7/2001 | Cho et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,437,563 B1 | 8/2002 | Simmonds et al. |
| 6,472,651 B1 | 10/2002 | Ukai |
| 6,472,869 B1 | 10/2002 | Upschulte et al. |
| 6,504,365 B2 | 1/2003 | Kitamura |
| 6,518,747 B2 | 2/2003 | Sager et al. |
| 6,542,242 B1 | 4/2003 | Yost et al. |
| 6,621,377 B2 | 9/2003 | Osadchy et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| 7,342,399 B1 | 3/2008 | Wiegert |
| RE40,343 E | 5/2008 | Anderson |
| 7,400,142 B2 | 7/2008 | Greelish |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,741,936 B1 | 6/2010 | Weller et al. |
| 7,805,030 B2 | 9/2010 | Bratkovski et al. |
| 7,868,702 B2 | 1/2011 | Ohnishi |
| 7,889,484 B2 | 2/2011 | Choi |
| 7,916,489 B2 | 3/2011 | Okuya |
| 7,932,718 B1 | 4/2011 | Wiegert |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,124,296 B1 | 2/2012 | Fischel |
| 8,138,756 B2 | 3/2012 | Barclay et al. |
| 8,193,808 B2 | 6/2012 | Fu et al. |
| 8,294,306 B2 | 10/2012 | Kumar et al. |
| 8,310,251 B2 | 11/2012 | Orazem |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,704,546 B2 | 4/2014 | Konstantinov |
| 8,758,509 B2 | 6/2014 | Twitchen et al. |
| 8,803,513 B2 | 8/2014 | Hosek et al. |
| 8,854,839 B2 | 10/2014 | Cheng et al. |
| 8,885,301 B1 * | 11/2014 | Heidmann ............ G11B 5/455 360/323 |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 1/2016 | Twitchen et al. |
| 9,270,387 B2 | 2/2016 | Wolfe et al. |
| 9,291,508 B1 | 3/2016 | Biedermann et al. |
| 9,317,811 B2 | 4/2016 | Scarsbrook |
| 9,369,182 B2 | 6/2016 | Kurs et al. |
| 9,442,205 B2 | 9/2016 | Geiser et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |

(56) References Cited

U.S. PATENT DOCUMENTS

| | | |
|---|---|---|
| 9,632,045 B2 | 4/2017 | Englund et al. |
| 9,645,223 B2 | 5/2017 | Megdal et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 9,778,329 B2 | 10/2017 | Heidmann |
| 9,779,769 B2 | 10/2017 | Heidmann |
| 9,891,297 B2 | 2/2018 | Sushkov et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0094942 A1 | 5/2003 | Friend et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0095133 A1 | 5/2004 | Nikitin et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Frederick Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1 | 3/2006 | Drew |
| 2006/0071709 A1 | 4/2006 | Maloberti et al. |
| 2006/0245078 A1 | 11/2006 | Kawamura |
| 2006/0247847 A1 | 11/2006 | Carter et al. |
| 2006/0255801 A1 | 11/2006 | Ikeda |
| 2006/0291771 A1 | 12/2006 | Braunisch et al. |
| 2007/0004371 A1 | 1/2007 | Okanobu |
| 2007/0120563 A1 | 5/2007 | Kawabata et al. |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0265895 A1 | 10/2008 | Strack et al. |
| 2008/0266050 A1 | 10/2008 | Crouse et al. |
| 2008/0279047 A1 | 11/2008 | An et al. |
| 2008/0299904 A1 | 12/2008 | Yi et al. |
| 2009/0001979 A1 | 1/2009 | Kawabata |
| 2009/0015262 A1 | 1/2009 | Strack et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0161264 A1 | 6/2009 | Meyersweissflog |
| 2009/0195244 A1 | 8/2009 | Mouget et al. |
| 2009/0222208 A1 | 9/2009 | Speck |
| 2009/0243616 A1 | 10/2009 | Loehken et al. |
| 2009/0244857 A1 | 10/2009 | Tanaka |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0102820 A1 | 4/2010 | Martinez et al. |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0271032 A1 | 10/2010 | Helwig |
| 2010/0277121 A1 | 11/2010 | Hall et al. |
| 2010/0308813 A1* | 12/2010 | Lukin ............... G01R 33/032 324/244.1 |
| 2010/0315079 A1 | 12/2010 | Lukin et al. |
| 2010/0321117 A1 | 12/2010 | Gan |
| 2010/0326042 A1 | 12/2010 | McLean et al. |
| 2011/0031969 A1 | 2/2011 | Kitching et al. |
| 2011/0034393 A1 | 2/2011 | Justen et al. |
| 2011/0059704 A1 | 3/2011 | Norimatsu et al. |
| 2011/0062957 A1* | 3/2011 | Fu .................... G01N 24/088 324/307 |
| 2011/0062967 A1 | 3/2011 | Mohaupt |
| 2011/0063957 A1 | 3/2011 | Isshiki et al. |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0165862 A1 | 7/2011 | Yu et al. |
| 2011/0175604 A1 | 7/2011 | Polzer et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2011/0279120 A1 | 11/2011 | Sudow et al. |
| 2011/0315988 A1 | 12/2011 | Yu et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0070252 A1 | 3/2013 | Feth |
| 2013/0093424 A1 | 4/2013 | Blank et al. |
| 2013/0107253 A1 | 5/2013 | Santori |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265042 A1 | 10/2013 | Kawabata et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2013/0292472 A1 | 11/2013 | Guha |
| 2014/0012505 A1 | 1/2014 | Smith et al. |
| 2014/0015522 A1 | 1/2014 | Widmer et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1* | 3/2014 | Twitchen ............... C30B 29/04 257/77 |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0153363 A1 | 6/2014 | Juhasz et al. |

(56) References Cited

U.S. PATENT DOCUMENTS

| | | |
|---|---|---|
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1* | 6/2014 | Pines .............. G01N 24/081 324/322 |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0197831 A1 | 7/2014 | Walsworth |
| 2014/0198463 A1 | 7/2014 | Klein |
| 2014/0210473 A1 | 7/2014 | Campbell et al. |
| 2014/0215985 A1 | 8/2014 | Pollklas |
| 2014/0225606 A1 | 8/2014 | Endo et al. |
| 2014/0247094 A1 | 9/2014 | Englund et al. |
| 2014/0264723 A1 | 9/2014 | Liang et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1* | 1/2015 | Englund ............ G01N 21/6458 250/459.1 |
| 2015/0009746 A1* | 1/2015 | Kucsko ............... G06N 99/002 365/152 |
| 2015/0015247 A1 | 1/2015 | Goodwill et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0061670 A1 | 3/2015 | Fordham et al. |
| 2015/0090033 A1 | 4/2015 | Budker et al. |
| 2015/0128431 A1 | 5/2015 | Kuo |
| 2015/0137793 A1* | 5/2015 | Englund ................ G01K 11/00 324/96 |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1* | 9/2015 | El Hallak ............... G11B 5/455 369/13.2 |
| 2015/0276897 A1 | 10/2015 | Leussler et al. |
| 2015/0288352 A1 | 10/2015 | Krause et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1 | 11/2015 | Malpas et al. |
| 2015/0326410 A1 | 11/2015 | Krause et al. |
| 2015/0354985 A1 | 12/2015 | Judkins et al. |
| 2015/0358026 A1 | 12/2015 | Gan |
| 2015/0374250 A1 | 12/2015 | Hatano et al. |
| 2015/0377865 A1* | 12/2015 | Acosta ................ G01N 33/5091 435/7.1 |
| 2015/0377987 A1 | 12/2015 | Menon et al. |
| 2016/0018269 A1 | 1/2016 | Maurer et al. |
| 2016/0031339 A1 | 2/2016 | Geo |
| 2016/0036529 A1 | 2/2016 | Griffith et al. |
| 2016/0052789 A1 | 2/2016 | Gaathon et al. |
| 2016/0054402 A1 | 2/2016 | Meriles |
| 2016/0061914 A1 | 3/2016 | Jelezko |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0113507 A1 | 4/2016 | Reza et al. |
| 2016/0131723 A1 | 5/2016 | Nagasaka |
| 2016/0139048 A1 | 5/2016 | Heidmann |
| 2016/0146904 A1 | 5/2016 | Stetson et al. |
| 2016/0161429 A1 | 6/2016 | Englund et al. |
| 2016/0161583 A1* | 6/2016 | Meriles .............. G01R 33/5605 324/309 |
| 2016/0174867 A1* | 6/2016 | Hatano ................. G01N 24/10 600/409 |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0282427 A1 | 9/2016 | Heidmann |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1* | 1/2017 | Bayat .................. G01R 33/323 |
| 2017/0010594 A1 | 1/2017 | Kottapalli et al. |
| 2017/0023487 A1 | 1/2017 | Boesch |
| 2017/0030982 A1 | 2/2017 | Jeske et al. |
| 2017/0038314 A1 | 2/2017 | Suyama et al. |
| 2017/0038411 A1 | 2/2017 | Yacobi et al. |
| 2017/0068012 A1 | 3/2017 | Fisk |
| 2017/0074660 A1 | 3/2017 | Gann et al. |
| 2017/0075020 A1 | 3/2017 | Gann et al. |
| 2017/0075205 A1 | 3/2017 | Kriman et al. |
| 2017/0077665 A1 | 3/2017 | Liu et al. |
| 2017/0104426 A1 | 4/2017 | Mills |
| 2017/0138735 A1 | 5/2017 | Cappellaro et al. |
| 2017/0139017 A1 | 5/2017 | Egan et al. |
| 2017/0146615 A1 | 5/2017 | Wolf et al. |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212258 A1 | 7/2017 | Fisk |
| 2017/0261629 A1 | 9/2017 | Gunnarsson et al. |
| 2017/0343617 A1 | 11/2017 | Manickam et al. |
| 2017/0343619 A1 | 11/2017 | Manickam et al. |
| 2017/0343621 A1 | 11/2017 | Hahn et al. |
| 2017/0343695 A1 | 11/2017 | Stetson et al. |
| 2018/0136291 A1 | 5/2018 | Pham et al. |
| 2018/0275209 A1 | 9/2018 | Mandeville et al. |
| 2018/0275212 A1 | 9/2018 | Hahn et al. |

FOREIGN PATENT DOCUMENTS

| | | |
|---|---|---|
| DE | 69608006 T2 | 2/2001 |
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |

(56) References Cited

FOREIGN PATENT DOCUMENTS

| | | |
|---|---|---|
| EP | 2 745 360 | 6/2014 |
| EP | 2 769 417 | 8/2014 |
| EP | 2 790 031 | 10/2014 |
| EP | 2 837 930 | 2/2015 |
| EP | 2 907 792 | 8/2015 |
| GB | 2 433 737 | 7/2007 |
| GB | 2423366 A | 8/2008 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2009/073736 | 6/2009 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/027074 | 2/2013 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 A1 | 10/2015 |
| WO | WO-2015/157290 A1 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 A1 | 7/2016 |
| WO | WO-2016/118791 A1 | 7/2016 |
| WO | WO-2016/122965 A1 | 8/2016 |
| WO | WO-2016/122966 A1 | 8/2016 |
| WO | WO-2016/126435 A1 | 8/2016 |
| WO | WO-2016/126436 A1 | 8/2016 |
| WO | WO-2016/190909 A2 | 12/2016 |
| WO | WO-2017/007513 A1 | 1/2017 |
| WO | WO-2017/007514 A1 | 1/2017 |
| WO | WO-2017/014807 A1 | 1/2017 |
| WO | WO-2017/039747 A1 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

PCT/US2015/021093, Mar. 17, 2015.
U.S. Appl. No. 14/676,740, filed Apr. 1, 2015.
PCT/US2015/024265, Apr. 3, 2015.
PCT/US2015/024723, Apr. 7, 2015.
U.S. Appl. No. 14/680,877, filed Apr. 7, 2015.
U.S. Appl. No. 14/866,730, filed Sep. 25, 2017.
U.S. Appl. No. 15/003,678, filed Jan. 21, 2016.
U.S. Appl. No. 15/003,281, filed Jan. 21, 2016.
U.S. Appl. No. 15/003,292, filed Jan. 21, 2016.
U.S. Appl. No. 15/003,298, filed Jan. 21, 2016.
U.S. Appl. No. 15/003,309, filed Jan. 21, 2016.
U.S. Appl. No. 15/003,176, filed Jan. 21, 2016.
U.S. Appl. No. 15/003,145, filed Jan. 21, 2016.
U.S. Appl. No. 15/003,336, filed Jan. 21, 2016.
U.S. Appl. No. 15/003,558, filed Jan. 21, 2016.
U.S. Appl. No. 15/003,519, filed Jan. 21, 2016.
U.S. Appl. No. 15/003,677, filed Jan. 21, 2016.
U.S. Appl. No. 15/003,256, filed Jan. 21, 2016.
U.S. Appl. No. 15/003,577, filed Jan. 21, 2016.
U.S. Appl. No. 15/003,704, filed Jan. 21, 2016.
U.S. Appl. No. 15/003,718, filed Jan. 21, 2016.
U.S. Appl. No. 15/003,062, filed Jan. 21, 2016.
U.S. Appl. No. 15/003,652, filed Jan. 21, 2016.
U.S. Appl. No. 15/003,634, filed Jan. 21, 2016.
U.S. Appl. No. 15/003,670, filed Jan. 21, 2016.
U.S. Appl. No. 15/003,088, filed Jan. 21, 2016.
U.S. Appl. No. 15/003,797, filed Jan. 21, 2016.
U.S. Appl. No. 15/003,590, filed Jan. 21, 2016.
U.S. Appl. No. 15/003,206, filed Jan. 21, 2016.
U.S. Appl. No. 15/003,193, filed Jan. 21, 2016.
U.S. Appl. No. 15/003,617, filed Jan. 21, 2016.
U.S. Appl. No. 15/003,396, filed Jan. 21, 2016.
U.S. Appl. No. 15/003,177, filed Jan. 21, 2016.
U.S. Appl. No. 15/003,209, filed Jan. 21, 2016.
PCT/US2016/014389, Jan. 21, 2016.
PCT/US2016/014336, Jan. 21, 2016.
PCT/US2016/014403, Jan. 21, 2016.
PCT/US2016/014331, Jan. 21, 2016.
PCT/US2016/014387, Jan. 21, 2016.
PCT/US2016/014390, Jan. 21, 2016.
PCT/US2016/014385, Jan. 21, 2016.
PCT/US2016/014375, Jan. 21, 2016.
PCT/US2016/014298, Jan. 21, 2016.
PCT/US2016/014297, Jan. 21, 2016.
PCT/US2016/014377, Jan. 21, 2016.
PCT/US2016/014392, Jan. 21, 2016.
PCT/US2016/014395, Jan. 21, 2016.
PCT/US2016/014394, Jan. 21, 2016.
PCT/US2016/014386, Jan. 21, 2016.
PCT/US2016/014333, Jan. 21, 2016.
PCT/US2016/014328, Jan. 21, 2016.
PCT/US2016/014325, Jan. 21, 2016.
PCT/US2016/014330, Jan. 21, 2016.
PCT/US2016/014388, Jan. 21, 2016.
PCT/US2016/014380, Jan. 21, 2016.
PCT/US2016/014290, Jan. 21, 2016.

(56) References Cited

OTHER PUBLICATIONS

PCT/US2016/014363, Jan. 21, 2016.
PCT/US2016/014287, Jan. 21, 2016.
PCT/US2016/014291, Jan. 21, 2016.
PCT/US2016/014396, Jan. 21, 2016.
PCT/US2016/014384, Jan. 21, 2016.
PCT/US2016/014376, Jan. 21, 2016.
U.S. Appl. No. 15/179,957, filed Jun. 10, 2016.
U.S. Appl. No. 15/207,457, filed Jul. 11, 2016.
U.S. Appl. No. 15/218,821, filed Jul. 25, 2016.
U.S. Appl. No. 15/204,675, filed Jul. 7, 2016.
U.S. Appl. No. 15/350,303, filed Nov. 14, 2016.
U.S. Appl. No. 15/351,862, filed Jul. 7, 2016.
U.S. Appl. No. 15/372,201, filed Dec. 7, 2016.
U.S. Appl. No. 15/376,244, filed Dec. 12, 2016.
PCT/US2016/066566, Dec. 14, 2016.
U.S. Appl. No. 15/380,691, filed Dec. 15, 2016.
U.S. Appl. No. 15/382,045, filed Dec. 16, 2016.
U.S. Appl. No. 15/380,419, filed Dec. 15, 2016.
PCT/US2016/068320, Dec. 22, 2016.
PCT/US2016/068344, Dec. 22, 2016.
PCT/US2016/068366, Dec. 22, 2016.
U.S. Appl. No. 15/419,832, filed Jan. 30, 2017.
U.S. Appl. No. 15/400,794, filed Jan. 6, 2017.
U.S. Appl. No. 15/443,422, filed Jan. 27, 2017.
PCT/US2017/017321, Feb. 10, 2017.
PCT/US2017/018099, Feb. 16, 2017.
U.S. Appl. No. 15/437,222, filed Feb. 20, 2017.
U.S. Appl. No. 15/437,038, filed Feb. 20, 2017.
PCT/US2017/018709, Feb. 21, 2017.
U.S. Appl. No. 15/440,194, filed Feb. 23, 2017.
PCT/US2017/019411, Feb. 24, 2017.
U.S. Appl. No. 15/446,373, filed Mar. 1, 2017.
U.S. Appl. No. 15/450,504, filed Mar. 6, 2017.
U.S. Appl. No. 15/454,162, filed Mar. 9, 2017.
PCT/US2017/021593, Mar. 9, 2017.
PCT/US2017/021811, Mar. 10, 2017.
U.S. Appl. No. 15/456,913, filed Mar. 13, 2017.
PCT/US2017/022118, Mar. 13, 2017.
PCT/US2017/022279, Mar. 14, 2017.
U.S. Appl. No. 15/468,356, filed Mar. 24, 2017.
U.S. Appl. No. 15/468,397, filed Mar. 24, 2017.
U.S. Appl. No. 15/468,386, filed Mar. 24, 2017.
U.S. Appl. No. 15/468,289, filed Mar. 24, 2017.
U.S. Appl. No. 15/468,641, filed Mar. 24, 2017.
U.S. Appl. No. 15/468,582, filed Mar. 24, 2017.
U.S. Appl. No. 15/468,410, filed Mar. 24, 2017.
U.S. Appl. No. 15/468,951, filed Mar. 24, 2017.
U.S. Appl. No. 15/468,559, filed Mar. 24, 2017.
U.S. Appl. No. 15/468,282, filed Mar. 24, 2017.
U.S. Appl. No. 15/468,314, filed Mar. 24, 2017.
U.S. Appl. No. 15/468,274, filed Mar. 24, 2017.
U.S. Appl. No. 15/468,303, filed Mar. 24, 2017.
U.S. Appl. No. 15/469,374, filed Mar. 24, 2017.
PCT/US17/24165, Mar. 24, 2017.
PCT/US17/24167, Mar. 24, 2017.
PCT/US17/24168, Mar. 24, 2017.
PCT/US17/24169, Mar. 24, 2017.
PCT/US17/24171, Mar. 24, 2017.
PCT/US17/24172, Mar. 24, 2017.
PCT/US17/18701, Feb. 21, 2017.
PCT/US17/24173, Mar. 24, 2017.
PCT/US17/24174, Mar. 24, 2017.
PCT/US17/24175, Mar. 24, 2017.
PCT/US17/24177, Mar. 24, 2017.
PCT/US17/24179, Mar. 24, 2017.
PCT/US17/24180, Mar. 24, 2017.
PCT/US17/24181, Mar. 24, 2017.
PCT/US17/24182, Mar. 24, 2017.
U.S. Appl. No. 15/476,636, filed Mar. 31, 2017.
U.S. Appl. No. 15/479,256, filed Apr. 4, 2017.
U.S. Notice of Allowance dated Oct. 19, 2017, from related U.S. Appl. No. 15/179,957, 5 pages.
U.S. Notice of Allowance dated Oct. 23, 2017, from related U.S. Appl. No. 15/003,797, 6 pages.
U.S. Office Action dated Nov. 24, 2017, from related U.S. Appl. No. 15/003,145, 14 pages.
U.S. Office Action dated Nov. 27, 2017, from related U.S. Appl. No. 15/468,386, 28 pages.
International Search Report and Written Opinion from related PCT application PCT/US2017/035315 dated Aug. 24, 2017, 7 pages.
Ramsey, et al., "Phase Shifts in the Molecular Beam Method of Separated Oscillating Fields", Physical Review, vol. 84, No. 3, Nov. 1, 1951, pp. 506-507.
U.S. Notice of Allowance on U.S. Appl. No. 14/676,740 dated Sep. 1, 2017, 7 pages.
U.S. Notice of Allowance on U.S. Appl. No. 15/003,206 dated Sep. 18, 2017, 11 pages.
U.S. Notice of Allowance on U.S. Appl. No. 15/003,281 dated Sep. 26, 2017, 7 pages.
U.S. Notice of Allowance on U.S. Appl. No. 15/476,636 dated Sep. 14, 2017, 10 pages.
U.S. Office Action on U.S. Appl. No. 15/003,176 dated Sep. 27, 2017, 8 pages.
U.S. Office Action on U.S. Appl. No. 15/003,292 dated Sep. 8, 2017, 8 pages.
GB Office Action dated Jan. 10, 2017, in related national stage application GB1618202.4.
U.S. Appl. No. 15/610,526, filed May 31, 2017.
PCT/US2017/035315, May 31, 2017.
U.S. Appl. No. 15/672,953, filed Aug. 9, 2017.
International Search Report and Written Opinion of the International Searching Authority in PCT/US2016/014390 dated Feb. 15, 2017.
Notice of Allowance dated Dec. 13, 2016, from related U.S. Appl. No. 14/680,877.
Notice of Allowance dated Dec. 22, 2016, from related U.S. Appl. No. 14/659,498.
U.S. Notice of Allowance dated Feb. 14, 2017, from related U.S. Appl. No. 15/003,677, 8 pages.
U.S. Office Action dated Feb. 10, 2017, from related U.S. Appl. No. 14/676,740, 38 pages.
U.S. Office Action dated Feb. 10, 2017, from related U.S. Appl. No. 15/003,088, 32 pages.
U.S. Office Action dated Feb. 16, 2017, from related U.S. Appl. No. 15/204,675, 15 pages.
European Extended Search Report for Appl. Ser. No. 16743879.5 dated Sep. 11, 2018, 11 pages.
European Extended Search Report for Appl. Ser. No. 16800410.9 dated Oct. 12, 2018, 11 pages.
Niu, "Crack Detection of Power Line Based on Metal Magnetic Memory Non-destructive", Telkomnika Indonesian Journal of Electrical Engineering, vol. 12, No. 11, Nov. 1, 2014, pp. 7764-7771.
U.S. Final Office Action for U.S. Appl. No. 15/380,691 dated Sep. 21, 2018, 12 pages.
U.S. Final Office Action for U.S. Appl. No. 15/479,256 dated Sep. 10, 2018, 20 pages.
U.S. Non-Final Office Action for U.S. Appl. No. 15/443,422 dated Oct. 2, 2018, 16 pages.
U.S. Non-Final Office Action for U.S. Appl. No. 15/446,373 dated Oct. 1, 2018, 13 pages.
U.S. Non-Final Office Action for U.S. Appl. No. 15/454,162 dated Sep. 10, 2018, 13 pages.
U.S. Non-Final Office Action for U.S. Appl. No. 15/468,282 dated Oct. 10, 2018, 12 pages.
U.S. Non-Final Office Action for U.S. Appl. No. 15/372,201 dated Oct. 15, 2018, 12 pages.
U.S. Non-Final Office Action for U.S. Appl. No. 15/468,274 dated Oct. 26, 2018, 11 pages.
U.S. Notice of Allowance for U.S. Appl. No. 14/866,730 dated Aug. 15, 2018, 9 pages.
U.S. Notice of Allowance for U.S. Appl. No. 15/468,289 dated Oct. 17, 2018, 12 pages.

(56) References Cited

OTHER PUBLICATIONS

U.S. Notice of Allowance for U.S. Appl. No. 15/003,704 dated Nov. 2, 2018, 19 pages.
U.S. Office Action for U.S. Appl. No. 15/468,397 dated Sep. 13, 2018, 7 pages.
Bui et al., "Noninvasive Fault Monitoring of Electrical Machines by Solving the Steady-State Magnetic Inverse Problem," in IEEE Transactions on Magnetics, vol. 44, No. 6, pp. 1050-1053, Jun. 24, 2008.
Chadebec et al., "Rotor fault detection of electrical machines by low frequency magnetic stray field analysis," 2005 5th IEEE International Symposium on Diagnostics for Electric Machines, Power Electronics and Drives, Vienna, 2005, submitted Mar. 22, 2006, pp. 1-6.
Froidurot et al., "Magnetic discretion of naval propulsion machines," in IEEE Transactions on Magnetics, vol. 38, No. 2, pp. 1185-1188, Mar. 2002.
IEEE Std 802.11 TM-2012 Wireless LAN Medium Access Control (MAC) and Physical Layer (PHY) Specifications, 1 page.
Kwon et al., "Analysis of the far field of permanent-magnet motors and effects of geometric asymmetries and unbalance in magnet design," in IEEE Transactions on Magnetics, vol. 40, No. 2, pp. 435-442, Mar. 2004.
Maertz et al., "Vector magnetic field microscopy using nitrogen vacancy centers in diamond", Applied Physics Letters 96, No. 9, Mar. 1, 2010, pp. 092504-1-092504-3.
U.S. Notice of Allowance dated Feb. 2, 2018, from related U.S. Appl. No. 15/003,292, 8 pages.
U.S. Notice of Allowance dated Feb. 21, 2018, from related U.S. Appl. No. 15/003,176, 9 pages.
U.S. Office Action dated Feb. 1, 2018, from related U.S. Appl. No. 15/003,577, 16 pages.
U.S. Office Action dated Feb. 5, 2018, from related U.S. Appl. No. 15/450,504, 12 pages.
U.S. Office Action dated Jan. 25, 2018, from related U.S. Appl. No. 15/672,953, 28 pages.
U.S. Office Action dated Jan. 26, 2018, from related U.S. Appl. No. 15/003,678, 14 pages.
U.S. Office Action dated Mar. 27, 2018, from related U.S. Appl. No. 15/468,386, 21 pages.
U.S. Office Action dated Mar. 28, 2018, from related U.S. Appl. No. 15/003,177, 12 pages.
U.S. Office Action dated Mar. 5, 2018, from related U.S. Appl. No. 14/866,730, 14 pages.
U.S. Office Action dated Mar. 8, 2018, from related U.S. Appl. No. 15/380,691, 12 pages.
U.S. Office Action dated Mar. 8, 2018, from related U.S. Appl. No. 15/479,256, 30 pages.
Wegerich, "Similarity based modeling of time synchronous averaged vibration signals for machinery health monitoring," 2004 IEEE Aerospace Conference Proceedings (IEEE Cat. No. 04TH8720), 2004, pp. 3654-3662 vol. 6.
Wikipedia, "Continuous phase modulation", downloaded from https://web.archive.org/web/20151017015236/https://en.wikipedia.org/wiki/Continuous_phase_modulation on May 10, 2017, 3 pages.
Wikipedia, "Minimum-shift keying", downloaded from https://web.archive.org/web/20151017175828/https://en.wikipedia.org/wiki/Minimum-shift_keying on May 10, 2017, 2 pages.
"Diamond Sensors, Detectors, and Quantum Devices' in Patent Application Approval Process" Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (U.S. Pat. No. 9,249,526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Acosta, "Optical Magnetometry with Nitrogen-Vacancy Centers in Diamond," University of California Berkeley, 2011.
Acosta, et al., "Diamonds with a high density of nitrogen-vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.
Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptor states in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Baranov, et al., "Enormously High Concentrations of Fluorescent Nitrogen-Vacancy Centers Fabricated by Sintering of Detonation Nanodiamonds," Small, Jun. 2011.
Barfuss, et al., "Strong mechanical driving of a single electron spin," Nature Physics, Oct. 2015.
Bennett, et al., "CVD Diamond for High Power Laser Applications," Proceedings of SPIE, Jan. 2013.
Berman & Chernobrod, "Single-spin microscope with sub-nanoscale resolution based on optically detected magnetic resonance," Proceedings of SPIE, May 2010.
Berman, et al. "Measurement of single electron and nuclear spin states based on optically detected magnetic resonance," J. Physics: Conf. Series 38: 167-170 (2006).
Blakley, et al., "Room-temperature magnetic gradiometry with fiber-coupled nitrogen-vacancy centers in diamond," Optics Letters, Aug. 2015.
Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.
Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.

(56) References Cited

OTHER PUBLICATIONS

Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resoncance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.
Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., "Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.
Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen, "Scanning magnetic field microscope with a diamond single-spin sensor ," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.
Doherty, et al., "Theory of the ground-state spin of the NV-center in diamond," Physical Review B, May 2012.
Doi, et al., "Pure negatively charged state of the NV center in n-type diamond," Physical Review B, Feb. 2016.
Drake, et al., "Influence of magnetic field alignment and defect concentration on nitrogen-vacancy polarization in diamond," New Journal of Physics, Jan. 2016.
Dreau, et al., "Avoiding power broadening in optically detected magnetic resonance of single NV defects for enhanced dc magnetic field sensitivity," Physical Review B, Nov. 2011.
Dreau, et al., "High-resolution spectroscopy of single NV defects coupled with nearby C-13 nuclear spins in diamond," Physical Review B, Apr. 2012.
Dumeige, et al., "Magnetometry with nitrogen-vacancy ensembles in diamond based on infrared absorption in a doubly resonant optical cavity," Physical Review B, Apr. 2013.
Epstein, et al., "Anisotropic interactions of a single spin and dark-spin spectroscopy in diamond," Center for Spintronics and Quantum Computation, 2005.
Fedotov, et al., "High-resolution magnetic field imaging with a nitrogen-vacancy diamond sensor integrated with a photonic-crystal fiber," Optics Letters, Feb. 2016.
Fedotov, et al., "Photonic-crystal-fiber-coupled photoluminescence interrogation of nitrogen vacancies in diamond nanoparticles," Laser Physics Letters, Feb. 2012.

Feng & Wei, "A steady-state spectral method to fit microwave absorptions of NV centers in diamonds: application to sensitive magnetic field sensing," Measurement Science & Technology, Oct. 2014.
Freitas, et al., "Solid-State Nuclear Magnetic Resonance (NMR) Methods Applied to the Study of Carbon Materials," Chemistry and Physics of Carbon, vol. 31, 2012.
Geiselmann, et al., "Fast optical modulation of the fluorescence from a single nitrogen-vacancy centre," Nature Physics, Dec. 2013.
Gombert & Blasi, "The Moth-Eye Effect-From Fundamentals to Commercial Exploitation," Functional Properties of Bio-Inspired Surfaces, Nov. 2009.
Gong, et al., "Generation of Nitrogen-Vacancy Center Pairs in Bulk Diamond by Molecular Nitrogen Implantation," Chinese Physics Letters, Feb. 2016.
Gould, et al., "An imaging magnetometer for bio-sensing based on nitrogen-vacancy centers in diamond," Proceedings of the SPIE—Progress in Biomedical Optics and Imaging, 2014.
Gould, et al., "Room-temperature detection of a single 19 nm super-paramagnetic nanoparticle with an imaging magnetometer," Applied Physics Letters, Aug. 2014.
Gruber, et al., "Scanning confocal optical microscopy and magnetic resonance on single defect centers," Science, Jun. 1997.
Haeberle, et al., "Nanoscale nuclear magnetic imaging with chemical contrast," Nature Nanotechnology, Feb. 2015.
Haihua, et al., "Design of wideband anti-reflective sub wavelength nanostructures," Infrared and Laser Engineering, 2011.
Hall, et al., "Sensing of Fluctuating Nanoscale Magnetic Fields Using Nitrogen-Vacancy Centers in Diamond," Physical Review Letters, Nov. 2009.
Hanson, et al., "Coherent Dynamics of a single spin interacting with an adjustable spin bath," Sci. Am. Ass'n. for the Advancement of Science, 2008.
Hanson, et al., "Polarization and Readout of Coupled Single Spins in Diamond," Physical Review Letters, 2006.
Hanson, et al., "Room-temperature manipulation and decoherence of a single spin in diamond," Physical Review, 2006.
Hanzawa, et al., "Zeeman effect on the zero-phonon line of the NV center in synthetic diamond," Physica B, Feb. 1993.
Hegyi & Yablonovitch, "Molecular imaging by optically detected electron spin resonance of nitrogen-vacancies in nanodiamonds," Nano Letters, Mar. 2013.
Hegyi & Yablonovitch, "Nanodiamond molecular imaging with enhanced contrast and expanded field of view," Journal of Biomedical Optics, Jan. 2014.
Hilser, et al., "All-optical control of the spin state in the NV-center in diamond," Physical Review B, Sep. 2012.
Hobbs, "Study of the Environmental and Optical Durability of AR Microstructures in Sapphire, ALON, and Diamond," Proceedings of SPIE, 2009.
Huebener, et al., "ODMR of NV centers in nano-diamonds covered with N©C60," Physica Status Solidi B, Oct. 2008.
Huxter, et al., "Vibrational and electronic dynamics of nitrogen-vacancy centres in diamond revealed by two-dimensional ultrafast spectroscopy," Nature Physics, Nov. 2013.
Ivady, et al., "Pressure and temperature dependence of the zero-field splitting in the ground state of NV centers in diamond: A first-principles study," Physical Review B, Dec. 2014.
Jarmola, et al., "Temperature- and Magnetic-Field-Dependent Longitudinal Spin Relaxation in Nitrogen-Vacancy Ensembles in Diamond," Physical Review Letters, May 2012.
Jensen, et al., "Light narrowing of magnetic resonances in ensembles of nitrogen-vacancy centers in diamond," Physical Review, Jan. 2013.
Kailath, "Linear Systems," Prentice Hall, 1979.
Karlsson, et al., "Diamond micro-optics: microlenses and antireflection structures surfaces for the infrared spectral region," Optics Express, 2003.
Khan & Hemmer, "Noise limitation in nano-scale imaging," Proceedings of SPIE, Dec. 2005.
Kim, et al., "Electron spin resonance shift and linewidth broadening of nitrogen-vacancy centers in diamond as a function of electron irradiation dose," Applied Physics Letters, Aug. 2012.

(56) References Cited

OTHER PUBLICATIONS

Kim, et al., "Magnetospectroscopy of acceptors in 'blue' diamonds," Physica B, Aug. 2001.
Kim, et al., "Zeeman effect of electronic Raman lines of accepters in elemental semiconductors: Boron in blue diamond," Physical Review B, Sep. 2000.
King, et al., "Optical polarization of 13C nuclei in diamond through nitrogen vacancy centers," Physical Review B, Feb. 2010.
Kok, et al., "Materials Science: Qubits in the pink," Nature, 2006.
Konenko, et al., "Formation of antireflective surface structures on diamond films by laser patterning," Applied Physics A, 1999.
Kraus, et al., "Magnetic field and temperature sensing with atomic-scale spin defects in silicon carbide," Scientific Reports, Jul. 2014.
Lai, et al., "Influence of a static magnetic field on the photoluminescence of an ensemble of nitrogen-vacancy color centers in a diamond single-crystal," Applied Physics Letters, Sep. 2009.
Lai, et al., "Optically detected magnetic resonance of a single Nitrogen-Vacancy electronic spin in diamond nanocrystals," CLEO/EQEC, 2009.
Laraoui, et al., "Nitrogen-vacancy-assisted magnetometry of paramagnetic centers in an individual diamond nanocrystal," Nano Letters, Jul. 2012.
Lazariev, et al., "A nitrogen-vacancy spin based molecular structure microscope using multiplexed projection reconstruction," Scientific Reports, Sep. 2015.
Lee, et al., "Vector magnetometry based on S=3/2 electronic spins," Physical Review B, Sep. 2015.
Lesik, et al., "Preferential orientation of NV defects in CVD diamond films grown on (113)-oriented substrates," Diamond and Related Materials, Jun. 2015.
Levchenko, et al., "Inhomogeneous broadening of optically detected magnetic resonance of the ensembles of nitrogen-vacancy centers in diamond by interstitial carbon atoms," Applied Physics Letters, Mar. 2015.
Liu, et al., "Electron spin studies of nitrogen vacancy centers in nanodiamonds," Acta Physica Sinica, Aug. 2013.
Liu, et al., "Fiber-integrated diamond-based magnetometer," Applied Physics Letters, Sep. 2013.
Maclaurin, et al., "Nanoscale magnetometry through quantum control of nitrogen-vacancy centres in rotationally diffusing nanodiamonds," New Journal of Physics, Jan. 2013.
Macs, et al., "Diamond as a magnetic field calibration probe," Journal of Physics D: Applied Physics, Apr. 2004.
Maletinsky, et al., "A robust scanning diamond sensor for nanoscale imaging with single nitrogen-vacancy centres," Nature Nanotechnology, May 2012.
Mamin, et al., "Multipulse Double-Quantum Magnetometry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Massachusetts Institute of Technology; "Wide-Field Imaging Using Nitrogen Vacancies" in Patent Application Approval Process, Physics Week (2015).
Matsuda, et al., "Development of a plastic diamond anvil cell for high pressure magneto-photoluminescence in pulsed high magnetic fields," International Journal of Modern Physics B, Nov. 2004.
Maze et al., "Nanoscale magnetic sensing with an individual electronic spin in diamond," Nature Physics (2008).
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.
Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.

Mrozek, et al., "Circularly polarized microwaves for magnetic resonance study in the GHz range: Application to nitrogen-vacancy in diamonds," Applied Physics Letters, Jul. 2015.
Nagl, et al., "Improving surface and defect center chemistry of fluorescent nanodiamonds for imaging purposes—a review," Analytical and Bioanalaytical Chemistry, Oct. 2015.
Neumann, et al., "Excited-state spectroscopy of single NV defects in diamond using optically detected magnetic resonance," New Journal of Physics, Jan. 2009.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H-(172) diamond cluster hosting nitrogen-vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(-)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.

(56) References Cited

OTHER PUBLICATIONS

Steinert et al., "High-sensitivity magnetic imaging using an array of spins in diamond," Rev. Sci. Inst. (2010).
Steinert, et al., "High sensitivity magnetic imaging using an array of spins in diamond," Review of Scientific Instruments, Apr. 2010.
Stepanov, et al., "High-frequency and high-field optically detected magnetic resonance of nitrogen-vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.
Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.
Fallah et al., "Multi-sensor approach in vessel magnetic wake imaging," Wave Motion 51(1): 60-76 (Jan. 2014), retrieved from http://www.sciencedirect.com/science/article/pii/S0165200113 (Aug. 21, 2016), 17 pages.
International Preliminary Report on Patentability dated Oct. 20, 2016 from related PCT application PCT/US2015/024723, 7 pages.
International Search Report and Written Opinion of the International Searching Authority dated Sep. 13, 2016 from related PCT application PCT/US16/14377, 11 pages.
Notice of Allowance dated Aug. 17, 2016, from related U.S. Appl. No. 15/003,718, 8 pages.
Notice of Allowance dated Sep. 8, 2016, from related patent U.S. Appl. No. 15/003,298, 10 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
U.S. Office Action dated Aug. 24, 2016 from related U.S. Appl. No. 14/676,740, 19 pages.
U.S. Office Action dated Oct. 14, 2016 from related U.S. Appl. No. 15/003,677, 13 pages.
U.S. Office Action dated Oct. 19, 2016 from related U.S. Appl. No. 15/218,821, 6 pages.
U.S. Office Action dated Nov. 2, 2016 from related U.S. Appl. No. 15/003,256, 19 pages.
U.S. Office Action dated Nov. 3, 2016 from related U.S. Appl. No. 15/204,675, 9 pages.
Widmann et al., "Coherent control of single spins in silicon carbide at room temperature," Nature Materials, 14: 164-168 (Feb. 2015) (available online Dec. 1, 2014), 5 pages.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.

(56) References Cited

OTHER PUBLICATIONS

International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Michaelovich et al., "Polarization Dependencies of the Nitrogen-Vacancy Center." Undergraduate Project Report, Ben-Gurion University, Aug. 2015, pp. 1-9.
Notice of Allowance dated Jun. 8, 2017, from related patent application U.S. Appl. No. 15/351,862, 7 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
U.S. Notice of Allowance dated Aug. 11, 2017 from related U.S. Appl. No. 15/003,558, 5 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
Wroble, "Performance Analysis of Magnetic Indoor Local Positioning System." Western Michigan University Master's Theses, Paper 609 (Jun. 2015), 42 pages.
Acosta et al., "Broadband magnetometry by infrared-absorption detection of nitrogen-vacancy ensembles in diamond," Appl. Phys. Letters 97: 174104 (Oct. 29, 2010), 4 pages.
Barry et al., "Optical magnetic detection of single-neuron action potentials using quantum defects in diamond," as submitted to Quantum Physics on Feb. 2, 2016, 23 pages.
Constable, "Geomagnetic Spectrum, Temporal." In Encyclopedia of Geomagnetism and Paleomagnetism, pp. 353-355, Springer: Dordrecht, Netherlands (2007).
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016 from related PCT application PCT/US2016/014389, 19 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016 from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016 from related PCT application PCT/US2016/014328, 7 pages.

(56) References Cited

OTHER PUBLICATIONS

International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev. B 85: 121202(R), pp. 121202-1-121202-4, (Mar. 23, 2012).
Macquarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051, pp. 1-12, (Dec. 2014).
Polatomic. "AN/ASQ-233A Digital Magnetic Anomaly Detecting Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Shao et al., "Diamond Color Center Based FM Microwave Demodulator," in Conference on Lasers and Electro-Optics, OSA Technical Digest (online) (Optical Society of America), paper JTh2A.136, 2 pages. (Jun. 5-10, 2016).
U.S. Notice of Allowance dated Apr. 20, 2016, from related U.S. Appl. No. 15/003,718, 9 pages.
U.S. Notice of Allowance dated Mar. 29, 2016, from related U.S. Appl. No. 15/003,590, 11 pages.
U.S. Office Action dated Jul. 29, 2016 from related U.S. Appl. No. 14/680,877, 8 pages.
U.S. Office Action dated May 13, 2016, from related U.S. Appl. No. 14/676,740, 15 pages.
U.S. Office Action dated May 6, 2016, from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
Brenneis, et al. "Ultrafast electronic readout of diamond nitrogen-vacancy centres coupled to graphene." Nature nanotechnology 10.2 (2015): 135-139.
Chavez, et al. "Detecting Arctic oil spills with NMR: a feasibility study." Near Surface Geophysics 13.4 (Feb. 2015): 409-416.
Dale, et al. "Medical applications of diamond magnetometry: commercial viability." arXiv preprint arXiv:1705.01994 (May 8, 2017), pp. 1-7.
Fologea, et al. "Detecting single stranded DNA with a solid state nanopore." Nano Letters 5.10 (Aug. 15, 2005): 1905-1909.
Gaebel, et al. "Room-temperature coherent coupling of single spins in diamond." Nature Physics 2.6 (May 28, 2006): 408-413.
Heerema, et al. "Graphene nanodevices for DNA sequencing." Nature nanotechnology 11.2 (Feb. 3, 2016): 127-136.
International Search Report and Written Opinion of the International Searching Authority dated Apr. 4, 2017 from related PCT application PCT/US16/68366, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 27, 2017 from related PCT application PCT/US16/68344, 6 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017, from related PCT application PCT/US17/18099, 16 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
Keyser "Enhancing nanopore sensing with DNA nanotechnology." Nature nanotechnology 11.2 (Feb. 2016): 106-108.
Lindsay "The promises and challenges of solid-state sequencing." Nature nanotechnology 11.2 (Feb. 2016): 109-111.
Matlashov, et al. "SQUIDs for magnetic resonance imaging at ultra-low magnetic field." Piers online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Moessle, et al. "SQUID-detected magnetic resonance imaging in microtesla fields." Annu. Rev. Biomed. Eng. 9 (May 23, 2008): 389-413.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Steinert et al., "Magnetic spin imaging under ambient conditions with sub-cellular resolution." Nature Comms 4:1607 (Mar. 19, 2013).
Sushkov, et al. "All-optical sensing of a single-molecule electron spin." Nano letters 14.11 (Nov. 7, 2013): 6443-6448.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
U.S. Notice of Allowance dated Mar. 15, 2017, from related U.S. Appl. No. 15/351,862, 6 pages.
U.S. Notice of Allowance dated May 26, 2017 from related U.S. Appl. No. 15/218,821, 7 pages.
U.S. Office Action dated Apr. 17, 2017, from related U.S. Appl. No. 15/003,558, 12 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 22, 2017, from related U.S. Appl. No. 15/003,206, 12 pages.
Wells, et al. "Assessing graphene nanopores for sequencing DNA." Nano letters 12.8 (Jul. 10, 2012): 4117-4123.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.

(56) References Cited

OTHER PUBLICATIONS

Teeling-Smith et al., "Electron Paramagnetic Resonance of a Single NV Nanodiamond Attached to an Individual Biomolecule", Biophysical Journal 110, May 10, 2016, pp. 2044-2052.
UK Office Action dated Jun. 8, 2018, from related application No. GB1617438.5, 3 pages.
U.S. Final Office Action dated Jul. 26, 2018 from related U.S. Appl. No. 15/003,177, 14 pages.
U.S. Non-Final Office Action dated Aug. 6, 2018 from related U.S. Appl. No. 15/376,244, 28 pages.
U.S. Non-Final Office Action dated Aug. 9, 2018 from related U.S. Appl. No. 15/003,309, 22 pages.
U.S. Non-Final Office Action dated Jul. 20, 2018 from related U.S. Appl. No. 15/350,303, 13 pages.
U.S. Non-Final Office Action dated Jul. 26, 2018 from related U.S. Appl. No. 15/380,419, 11 pages.
U.S. Non-Final Office Action dated Jul. 3, 2018 from related U.S. Appl. No. 15/003,396, 19 pages.
U.S. Notice of Allowance dated Jul. 18, 2018 from related U.S. Appl. No. 15/468,386, 12 pages.
U.S. Notice of Allowance dated Jul. 6, 2018 from related U.S. Appl. No. 15/672,953, 11 pages.
U.S. Notice of Allowance dated Jun. 27, 2018 from related U.S. Appl. No. 15/003,519, 21 pages.
U.S. Notice of Allowance dated May 15, 2018, from related U.S. Appl. No. 15/003,209, 7 pages.
U.S. Notice of Allowance dated May 16, 2018, from related U.S. Appl. No. 15/003,145, 8 pages.
U.S. Office Action dated Jun. 19, 2018, from related U.S. Appl. No. 15/450,504, 12 pages.
European Extended Search Report for Appl. U.S. Appl. No. 16740794.9 dated Nov. 12, 2018, 12 pages.
Halbach et al., "Design of Permanent Multipole Magnets with Oriented Rare Earth Cobalt Material", Nuclear Instruments and Methods, North Holland Publishing Co., Amsterdam, NL., vol. 169, Jan. 1, 1980, pp. 1-5, XP001032085, DOI: 10.1016/0029-554X(80)90094-4.
Hodges et al., "Time-keeping with electron spin states in diamond", Dept. Of Electrical Engineering and Dept. Of Applied Physics and Applied Mathematics, Columbia University, New York, New York 10027, Aug. 30, 2011, 13 pages.
Hodges et al., Appendix, "Time-keeping with electron spin states in diamond", Dept. Of Electrical Engineering and Dept. Of Applied Physics and Applied Mathematics, Columbia University, New York, New York 10027, Aug. 27, 2012, 46 pages.
International Search Report and Written Opinion for PCT Appl. U.S. Appl. No. PCT/US2018/041527 dated Feb. 4, 2019, 22 pages.
U.S. Ex Parte Quayle Action for U.S. Appl. No. 15/468,641 dated Nov. 28, 2018, 11 pages.
U.S. Non-Final Office Action for U.S. Appl. No. 15/003,177 dated Jan. 14, 2019, 15 pages.
U.S. Non-Final Office Action for U.S. Appl. No. 15/382,045 dated Dec. 31, 2018, 16 pages.
U.S. Non-Final Office Action for U.S. Appl. No. 15/400,794 dated Jan. 10, 2019, 6 pages.
U.S. Non-Final Office Action for U.S. Appl. No. 15/468,356 dated Jan. 2, 2019, 10 pages.
U.S. Non-Final Office Action for U.S. Appl. No. 15/468,951 dated Dec. 13, 2018, 9 pages.
U.S. Notice of Allowance for U.S. Appl. No. 15/350,303 dated Dec. 26, 2018, 10 pages.
U.S. Notice of Allowance for U.S. Appl. No. 15/450,504 dated Dec. 13, 2018, 7 pages.
U.S. Notice of Allowance for U.S. Appl. No. 15/454,162 dated Jan. 17, 2019, 8 pages.
U.S. Notice of Allowance for U.S. Appl. No. 15/468,397 dated Dec. 12, 2018, 5 pages.
U.S. Notice of Allowance for U.S. Appl. No. 15/468,641 dated Feb. 7, 2019, 10 pages.
U.S. Notice of Allowance for U.S. Appl. No. 15/479,256 dated Feb. 4, 2019, 7 pages.
International Search Report and Written Opinion for PCT Appl. U.S. Appl. No. PCT/US2018/041411 dated Feb. 8, 2019, 13 pages.
Rosskopf, "Advanced quantum sensing using nitrogen vacancy centers in diamond", Dissertation, ETH Zurich, 2016, p. 91 (12 pages), XP055500261, DOI: 10.3929/ethz-b-000168296 Retrieved from the Internet: URL: https://epo.summon.serialssolutions.com/2.0.0/1Ink/0/elvHCXMwY2BQsUxJMUsOMJTWNQWwlomqZYWuo1J5qa6qaagq5BSjEzMLUG7kS0dTULczYPcTXwQHUXQqkrUWXXQ_a21WpJR pZukC26gWBhZmjEzsAJbAuaWkH1HrEqAZSIojWVyZkkqUoXhJsjA44100S3EwJSaJ8Lg5AidcFcoLAV6qDRXoRi0fDwvXaEUTAJzV1E-MEIVylIKTQYWeAmJULB5ppCZpwCMRmCCSRFIMHVzDXH201X.
Schonfeld, "Optical readout of single spins for quantum computing and magnetic sensing", Dissertation, Fachbereich Physlk der Freien Universitat Berlin, May 1, 2011, 21 Pages (relevant pages only), XP055143403. Retrieved from the Internet: URL: http://www.dlss.fu-berlIn.de/diss/servlets/MCRFIleNodeServIeUFU DISS_derivate _00000001219 9/DIssertatIon_Slmon-choenfela_PublIcVersion-2.pdfJsessionid-89A943688E59.
U.S. Final Office Action for U.S. Appl. No. 15/003,396 dated Mar. 22, 2019, 13 pages.
U.S. Final Office Action for U.S. Appl. No. 15/382,045 dated Apr. 26, 2019, 16 pages.
U.S. Final Office Action for U.S. Appl. No. 15/443,422 dated Mar. 7, 2019, 17 pages.
U.S. Non-Final Office Action for U.S. Appl. No. 15/003,193 dated Apr. 11, 2019, 7 pages.
U.S. Non-Final Office Action for U.S. Appl. No. 15/003,309 dated Feb. 13, 2019, 16 pages.
U.S. Non-Final Office Action for U.S. Appl. No. 15/003,617 dated Feb. 26, 2019, 10 pages.
U.S. Non-Final Office Action for U.S. Appl. No. 15/372,201 dated Apr. 2, 2019, 10 pages.
U.S. Non-Final Office Action for U.S. Appl. No. 15/419,832 dated Feb. 8, 2019, 12 pages.
U.S. Non-Final Office Action for U.S. Appl. No. 15/440,194 dated Feb. 15, 2019, 21 pages.
U.S. Non-Final Office Action for U.S. Appl. No. 15/446,373 dated Apr. 19, 2019, 8 pages.
U.S. Non-Final Office Action for U.S. Appl. No. 15/468,314 dated Mar. 28, 2019, 17 pages.
U.S. Non-Final Office Action for U.S. Appl. No. 15/468,410 dated Apr. 11, 2019, 15 pages.
U.S. Non-Final Office Action for U.S. Appl. No. 15/468,559 dated Apr. 11, 2019, 12 pages.
U.S. Non-Final Office Action for U.S. Appl. No. 15/469,374 dated Feb. 28, 2019, 14 pages.
U.S. Notice of Allowance for U.S. Appl. No. 15/003,617 dated Apr. 30, 2019, 9 pages.
U.S. Notice of Allowance for U.S. Appl. No. 15/207,457 dated Mar. 6, 2019, 16 pages.
U.S. Notice of Allowance for U.S. Appl. No. 15/376,244 dated Feb. 21, 2019, 7 pages.
U.S. Notice of Allowance for U.S. Appl. No. 15/380,419 dated Feb. 26, 2019, 5 pages.
U.S. Notice of Allowance for U.S. Appl. No. 15/400,794 dated Apr. 25, 2019, 5 pages.
U.S. Notice of Allowance for U.S. Appl. No. 15/437,038 dated Mar. 21, 2019, 13 pages.
U.S. Notice of Allowance for U.S. Appl. No. 15/437,222 dated Mar. 25, 2019, 11 pages.
U.S. Notice of Allowance for U.S. Appl. No. 15/468,282 dated Feb. 19, 2019, 8 pages.
U.S. Notice of Allowance for U.S. Appl. No. 15/468,56 dated Apr. 22, 2019, 8 pages.
U.S. Notice of Allowance for U.S. Appl. No. 15/468,582 dated Mar. 21, 2019, 13 pages.

(56) References Cited

OTHER PUBLICATIONS

U.S. Notice of Allowance for U.S. Appl. No. 15/468,951 dated Mar. 28, 2019, 8 pages.

* cited by examiner

AC VECTOR MAGNETIC ANOMALY DETECTION WITH DIAMOND NITROGEN VACANCIES

CROSS-REFERENCE TO RELATED PATENT APPLICATIONS

The present application is related to co-pending U.S. Applications having Ser. No. 15/003,590, filed Jan. 21, 2016, entitled "APPARATUS AND METHOD FOR HIGH SENSITIVITY MAGNETOMETRY MEASUREMENT AND SIGNAL PROCESSING IN A MAGNETIC DETECTION SYSTEM", which is incorporated by reference herein in its entirety.

BACKGROUND

The disclosure generally relates to a system for AC vector magnetic anomaly detection. Magnetic sensors based on a nitrogen vacancy (NV) center in diamond are known. Diamond NV (DNV) sensors may provide good sensitivity for magnetic field measurements. In particular, U.S. Pat. No. 8,120,355 to Stetson describes a magnetic anomaly detector based on a DNV magnetic sensor.

SUMMARY

According to one embodiment, there may be provided a system for magnetic detection. The system comprises: a nitrogen vacancy (NV) diamond material comprising a plurality of NV centers; a magnetic field generator configured to generate a magnetic field; a radio frequency (RF) excitation source configured to provide RF excitation to the NV diamond material; an optical excitation source configured to provide optical excitation to the NV diamond material; an optical detector configured to receive an optical signal emitted by the NV diamond material; and a controller configured to: control the magnetic field generator to apply a time varying magnetic field at the NV diamond material, determine a magnitude and direction of the magnetic field at the NV diamond material based on a received light detection signal from the optical detector, and determine a magnetic vector anomaly due to an object based on the determined magnitude and direction of the magnetic field according to a frequency dependent attenuation of the time varying magnetic field.

According to one aspect, the object may be ferrous.

According to another aspect, the object may be non-ferrous.

According to another embodiment, there may be provided a system for magnetic detection. The system comprises: a nitrogen vacancy (NV) diamond material comprising a plurality of NV centers; a magnetic field generator comprising at least two magnetic field generators including a first magnetic field generator configured to generate a first magnetic field and a second magnetic field generator configured to generate a second magnetic field; a radio frequency (RF) excitation source configured to provide RF excitation to the NV diamond material; an optical excitation source configured to provide optical excitation to the NV diamond material; an optical detector configured to receive an optical signal emitted by the NV diamond material; and a controller configured to: modulate a first code packet and control the first magnetic field generator to apply a first time varying magnetic field at the NV diamond material based on the modulated first code packet, modulate a second code packet and control the second magnetic field generator to apply a second time varying magnetic field at the NV diamond material based on the modulated second code packet, wherein the first code packet and the second code packet are binary sequences which have a low cross correlation with each other, and each of the binary sequences has a good autocorrelation.

According to one aspect, a direction of the first time varying magnetic field at the NV diamond material may be different from a direction of the second time varying magnetic field at the NV diamond material.

According to another aspect, the controller may be further configure to: receive first light detection signals from the optical detector based on the optical signal emitted by the NV diamond material based on the first code packet transmitted to the NV diamond material, and receive second light detection signals from the optical detector based on the optical signal emitted by the NV diamond material based on the second code packet transmitted to the NV diamond material simultaneous with the first code packet being transmitted to the NV diamond material; apply matched filters to the received first and second light detection signals to demodulate the first and second code packets, determine a magnitude and direction of the first magnetic field and the second magnetic field at the NV diamond material based on the demodulated first and second code packets; and determine a magnetic vector anomaly based on the determined magnitude and direction of the first magnetic field and the second magnetic field.

According to another aspect, the first and second code packets may be modulated by continuous phase modulation.

According to another aspect, the first and second code packets may be modulated by MSK frequency modulation.

According to another embodiment, there may be provided a system for magnetic detection. The system comprises: a nitrogen vacancy (NV) diamond material comprising a plurality of NV centers; a magnetic field generator configured to generate a magnetic field; a radio frequency (RF) excitation source configured to provide RF excitation to the NV diamond material; an optical excitation source configured to provide optical excitation to the NV diamond material; an optical detector configured to receive an optical signal emitted by the NV diamond material; and a controller configured to: control the magnetic field generator to apply a time varying magnetic field at the NV diamond material, determine a magnitude and direction of the magnetic field at the NV diamond material based on a received light detection signal from the optical detector, and determine a magnetic vector anomaly based on the determined magnitude and direction of the magnetic field.

According to one aspect, the magnetic field generator comprising two or more magnetic field generators including a first magnetic field generator configured to generate a first magnetic field at the NV diamond material in a first direction and a second magnetic field generator configured to generate a second magnetic field at the NV diamond material in a second direction different from the first direction.

According to another aspect, the first direction may be orthogonal to the second direction.

According to another aspect, the controller may be configured to: modulate a first code packet and control the first magnetic field generator to apply a first time varying magnetic field at the NV diamond material based on the modulated first code packet, and modulate a second code packet and control the second magnetic field generator to apply a second time varying magnetic field at the NV diamond material based on the modulated second code packet, wherein the first code packet and the second code packet are binary sequences which have a low cross correlation with each other, and each of the binary sequences has a good autocorrelation.

According to another embodiment, there may be provided a system for magnetic detection. The system comprises: a nitrogen vacancy (NV) diamond material comprising a plurality of NV centers; a magnetic field generator comprising two or more magnetic field generators including a first magnetic field generator configured to generate a first magnetic field and a second magnetic field generator configured to generate a second magnetic field; a radio frequency (RF) excitation source configured to provide RF excitation to the NV diamond material; an optical excitation source configured to provide optical excitation to the NV diamond material; an optical detector configured to receive an optical signal emitted by the NV diamond material; and a controller configured to: control the first magnetic field generator to apply a first time varying magnetic field at the NV diamond material, control the second magnetic field generator to apply a second time varying magnetic field at the NV diamond material, wherein a direction of the first time varying magnetic field at the NV diamond material is different from a direction of the second time varying magnetic field at the NV diamond material, determine a magnitude and direction of the first magnetic field and the second magnetic field at the NV diamond material based on the received light detection signal from the optical detector; and determine a magnetic vector anomaly based on the determined magnitude and direction of the first magnetic field and the second magnetic field.

According to one aspect, the direction of the first magnetic field at the NV diamond material may be orthogonal to the direction of the second magnetic field at the NV diamond material.

According to another aspect, the controller may be configured to control the RF excitation source and the optical excitation source to provide a sequence of pulses to the NV diamond material.

According to another aspect, the sequence of pulses may be a Ramsey sequence.

According to another aspect, the controller may be configured to: modulate a first code packet and control the first magnetic field generator to apply a first time varying magnetic field at the NV diamond material based on the modulated first code packet, and modulate a second code packet and control the second magnetic field generator to apply a second time varying magnetic field at the NV diamond material based on the modulated second code packet, wherein the first code packet and the second code packet are binary sequences which have a low cross correlation with each other, and each of the binary sequences has as good autocorrelation.

According to another embodiment, there may be provided a system for magnetic detection. The system comprises: a nitrogen vacancy (NV) diamond material comprising a plurality of NV centers; a magnetic field generator configured to generate a magnetic field; a radio frequency (RF) excitation source configured to provide RF excitation to the NV diamond material; an optical excitation source configured to provide optical excitation to the NV diamond material; an optical detector configured to receive an optical signal emitted by the NV diamond material; and a controller configured to: control the magnetic field generator to apply a first magnetic field at the NV diamond material and to apply a second magnetic field at the NV diamond material having a direction different from the first magnetic field; control the RF excitation source and the optical excitation source to provide a sequence of pulses to the NV diamond material; receive a light detection signal from the optical detector based on the optical signal emitted by the NV diamond material based on the sequence of pulses; determine a magnitude and direction of the first magnetic field and the second magnetic field at the NV diamond material based on the received light detection signal from the optical detector; and determine a magnetic vector anomaly based on the determined magnitude and direction of the first magnetic field and the second magnetic field.

According to another aspect, a direction of the first magnetic field at the NV diamond material may be orthogonal to a direction of the second magnetic field at the NV diamond material.

According to another aspect, the sequence of pulses may be a Ramsey sequence.

According to another aspect, the controller may be configured to: modulate a first code packet and control the first magnetic field generator to apply a first time varying magnetic field at the NV diamond material based on the modulated first code packet, and modulate a second code packet and control the second magnetic field generator to apply a second time varying magnetic field at the NV diamond material based on the modulated second code packet, wherein the first code packet and the second code packet are binary sequences which have a low cross correlation with each other, and each of the binary sequences has as good autocorrelation.

According to another aspect, the controller may be further configured to identify an object corresponding to the magnetic vector anomaly.

According to another embodiment, there may be provided a system for magnetic detection. The system comprises: a nitrogen vacancy (NV) diamond material comprising a plurality of NV centers; a magnetic field generator configured to generate a magnetic field; a radio frequency (RF) excitation source configured to provide RF excitation to the NV diamond material; an optical excitation source configured to provide optical excitation to the NV diamond material; an optical detector configured to receive an optical signal emitted by the NV diamond material; and a control unit for: controlling the magnetic field generator to apply a time varying magnetic field at the NV diamond material; determining a magnitude and direction of the magnetic field at the NV diamond material based on a received light detection signal from the optical detector; and determining a magnetic vector anomaly based on the determined magnitude and direction of the magnetic field.

According to one aspect, the controller may be further configured to identify an object corresponding to the magnetic vector anomaly.

According to another aspect, the controller may be further configured to identify an object corresponding to the magnetic vector anomaly based on comparing the determined magnetic vector anomaly with magnetic vector anomalies stored in a reference library.

According to another embodiment, there may be provided a system for magnetic detection. The system comprises: a magneto-optical defect center material; a magnetic field generator comprising at least two magnetic field generators including at least two magnetic field generators including a first magnetic field generator configured to generate a first magnetic field and a second magnetic field generator configured to generate a second magnetic field; a radio frequency (RF) excitation source configured to provide RF excitation to the magneto-optical defect center material; an optical excitation source configured to provide optical excitation to the magneto-optical defect center material; an optical detector configured to receive an optical signal emitted by the magneto-optical defect center material; and a controller configured to: modulate a first code packet and control the first magnetic field generator to apply a first time varying magnetic field at the magneto-optical defect center material based on the modulated first code packet, modulate a second code packet and control the second magnetic field generator to apply a second time varying magnetic field at the magneto-optical defect center material based on the modulated second code packet, wherein the first code packet and the second code packet are binary sequences which have a low cross correlation with each other, and each of the binary sequences has as good autocorrelation.

According to one aspect, a direction of the first time varying magnetic field at the magneto-optical defect center material may be different from a direction of the second time varying magnetic field at the magneto-optical defect center material.

According to another aspect, the controller may be further configured to: receive first light detection signals from the optical detector based on the optical signal emitted by the magneto-optical defect center material based on the first code packet transmitted to the magneto-optical defect center material, and receive second light detection signals from the optical detector based on the optical signal emitted by the magneto-optical defect center material based on the second code packet transmitted to the magneto-optical defect center material simultaneous with the first code packet being transmitted to the NV diamond material; apply matched filters to the received first and second light detection signals to demodulate the first and second code packets, determine a magnitude and direction of the first magnetic field and the second magnetic field at the magneto-optical defect center material based on the demodulated first and second code packets; and determine a magnetic vector anomaly based on the determined magnitude and direction of the first magnetic field and the second magnetic field.

According to another aspect, the first and second code packets may be modulated by continuous phase modulation.

According to another aspect, the first and second code packets may be modulated by MSK frequency modulation.

According to another embodiment, there may be provided a system for magnetic detection. The system comprises: a magneto-optical defect center material; a magnetic field generator configured to generate a magnetic field; a radio frequency (RF) excitation source configured to provide RF excitation to the magneto-optical defect center material; an optical excitation source configured to provide optical excitation to the magneto-optical defect center material; an optical detector configured to receive an optical signal emitted by the magneto-optical defect center material; and a controller configured to: control the magnetic field generator to apply a first magnetic field at the magneto-optical defect center material and to apply a second magnetic field at the magneto-optical defect center material having a direction different from the first magnetic field; control the RF excitation source and the optical excitation source to provide a sequence of pulses to the magneto-optical defect center material; receive a light detection signal from the optical detector based on the optical signal emitted by the magneto-optical defect center material based on the sequence of pulses; determine a magnitude and direction of the first magnetic field and the second magnetic field at the magneto-optical defect center material based on the received light detection signal from the optical detector; and determine a magnetic vector anomaly based on the determined magnitude and direction of the first magnetic field and the second magnetic field.

According to another embodiment, there may be provided a system for magnetic detection. The system comprises: a magneto-optical defect center material; a magnetic field generator configured to generate a magnetic field; a radio frequency (RF) excitation source configured to provide RF excitation to the magneto-optical defect center material; an optical excitation source configured to provide optical excitation to the magneto-optical defect center material; an optical detector configured to receive an optical signal emitted by the magneto-optical defect center material; and a controller configured to: control the magnetic field generator to apply a time varying magnetic field at the magneto-optical defect center material; determine a magnitude and direction of the magnetic field at the magneto-optical defect center material based on a received light detection signal from the optical detector; and determine a magnetic vector anomaly based on the determined magnitude and direction of the magnetic field.

According to another embodiment, there may be provided a system for magnetic detection. The system comprises: a nitrogen vacancy (NV) diamond material comprising a plurality of NV centers; a magnetic field generator means comprising at least two magnetic field generators including a first magnetic field generator means configured for generating a first magnetic field and a second magnetic field generator mean for generating a second magnetic field; a radio frequency (RF) excitation means for providing RF excitation to the NV diamond material; an optical excitation means for providing optical excitation to the NV diamond material; an optical detection means for receiving an optical signal emitted by the NV diamond material; and a control means for: modulating a first code packet and controlling the first magnetic field generator means to apply a first time varying magnetic field at the NV diamond material based on the modulated first code packet, modulating a second code packet and controlling the second magnetic field generator means to apply a second time varying magnetic field at the NV diamond material, simultaneous with the first time varying magnetic field being applied at the NV diamond material, based on the modulated second code packet, wherein the first code packet and the second code packet are binary sequences which have a low cross correlation with each other, and each of the binary sequences has a good autocorrelation.

According to one aspect, a direction of the first time varying magnetic field at the NV diamond material may be different from a direction of the second time varying magnetic field at the NV diamond material.

According to another aspect, the control means may be further for: receiving first light detection signals from the optical detection means based on the optical signal emitted by the NV diamond material based on the first code packet transmitted to the NV diamond material, and receiving second light detection signals from the optical detection means based on the optical signal emitted by the NV diamond material based on the second code packet transmitted to the NV diamond material simultaneous with the first code packet transmitted to the NV diamond material; applying matched filters to the received first and second light detection signals to demodulate the first and second code packets, determining a magnitude and direction of the first magnetic field and the second magnetic field at the NV diamond material based on the demodulated first and second code packets; and determining a magnetic vector anomaly based on the determined magnitude and direction of the first magnetic field and the second magnetic field.

According to another aspect, the first and second code packets may be modulated by continuous phase modulation.

According to another aspect, the first and second code packets may be modulated by MSK frequency modulation.

According to another embodiment, there may be provided a system for magnetic detection. The system comprises: a nitrogen vacancy (NV) diamond material comprising a plurality of NV centers; a magnetic field generator means for generating a magnetic field; a radio frequency (RF) excitation means for providing RF excitation to the NV diamond material; an optical excitation means for providing optical excitation to the NV diamond material; an optical detection means for receiving an optical signal emitted by the NV diamond material; and a control means for: controlling the magnetic field generator means to apply a first magnetic field at the NV diamond material and to apply a second magnetic field at the NV diamond material having a direction different from the first magnetic field; controlling the RF excitation means and the optical excitation means to provide a sequence of pulses to the NV diamond material; receiving a light detection signal from the optical detection means based on the optical signal emitted by the NV diamond material based on the sequence of pulses; determining a magnitude and direction of the first magnetic field and the second magnetic field at the NV diamond material based on the received light detection signal from the optical detection means; and determining a magnetic vector anomaly based on the determined magnitude and direction of the first magnetic field and the second magnetic field.

According to another embodiment, there may be provided a system for magnetic detection. The system comprises: a nitrogen vacancy (NV) diamond material comprising a plurality of NV centers; a magnetic field generator means for generating a magnetic field; a radio frequency (RF) excitation means of providing RF excitation to the NV diamond material; an optical excitation means of providing optical excitation to the NV diamond material; an optical detection means for receiving an optical signal emitted by the NV diamond material; and a control means for: controlling the magnetic field generator means to apply a time varying magnetic field at the NV diamond material; determining a magnitude and direction of the magnetic field at the NV diamond material based on a received light detection signal from the optical detection means; and determining a magnetic vector anomaly based on the determined magnitude and direction of the magnetic field.

DETAILED DESCRIPTION

Improved magnetic anomaly detection may be accomplished by incorporating a magnetic field generator which generates two or more separate magnetic fields at the NV diamond material, or other magneto-optical material, where the magnetic fields may be orthogonal to each other. The magnetic fields may generated in two or more different channels, where the effect on the magnetic field due to a nearby magnetic object in the two or more different channels provides an increased number of magnetic parameters, which enhances the identification of the object.

Applying the magnetic field for the two or more different channels can be accomplished by modulating the magnetic field applied and transmission of correlated code, such as gold code, packets, followed by detection and demodulation of the code packets. The different correlated codes for the different channels are binary sequences which are optimized for a low cross correlation, and have a good autocorrelation. The correlated code packets may be demodulated using matched filtering providing magnetic field components along different diamond lattice directions. A magnetic vector may then be reconstructed using the magnetic field components, providing a reconstructed magnetic field vector for each of the channels. Additionally, matched filter phase information is used to eliminate directional ambiguities, where the relative phase between the matched filter response to a given correlated code on each of the NV axis orientations being probed is used in the reconstruction. This provides sign information for each of the vector components of the magnetic field eliminating ambiguities in the vector direction. The reconstructed magnetic field vectors of each of the channels may be compared to reference magnetic field vectors corresponding to objects with different magnetic material profiles to identify the object.

The transmission of code packets using correlated codes may provide gain as compared to simple DC transmission. In particular, longer codes provide an increased gain, but require a longer time for transmission.

Some embodiments allow for frequency based detection based on frequency dependent attenuation in the magnetic field provided by a magnetic field generator. A ferrous or non-ferrous object may be detected. For example, if a non-ferrous object provides for a frequency dependent attenuation in the magnetic field provided by the magnetic field generator, the non-ferrous object may be detected.

While frequency based detection may allow for a greater range of objects detected, the frequency based detection may further allow for operation in a less noisy environment. In this case, the frequency range is set to a range with less noise.

A pulsed sequence technique, such as a Ramsey sequence, may be applied for the optical detection based on the magnetic field.

NV Center, its Electronic Structure, and Optical and RF Interaction

Figure 1:
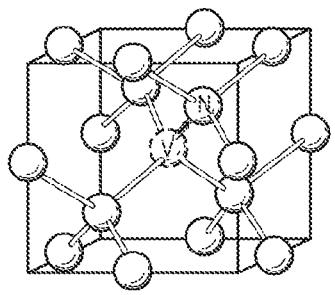
FIG. 1 illustrates one orientation of a NV center in a diamond lattice.

The NV center in diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. Conventionally, the neutral charge state uses the nomenclature $NV^0$, while the negative charge state uses the nomenclature NV, which is adopted in this description.

The NV center has a number of electrons including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
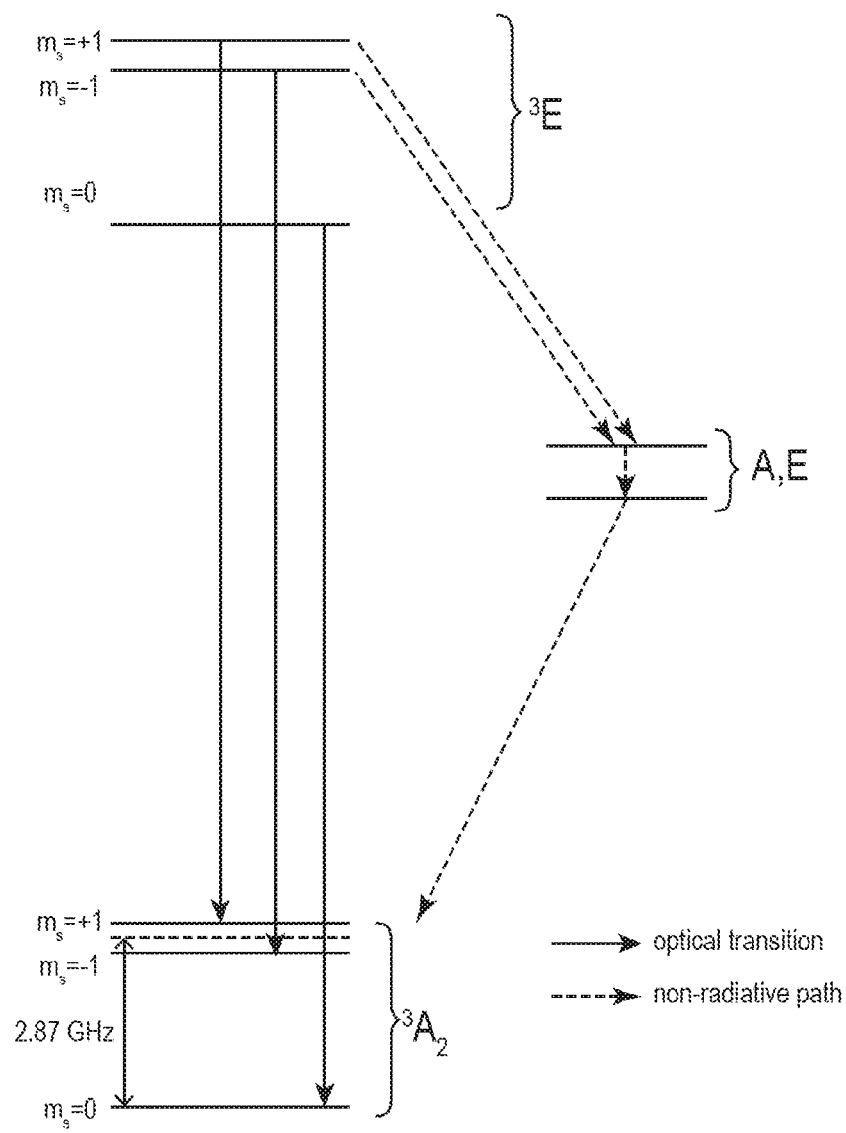
FIG. 2 is an energy level diagram illustrating energy levels of spin states for the NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm 1$ energy levels are offset from the $m_s=0$ due to spin-spin interactions, and the $m_s=\pm 1$ energy levels are degenerate, i.e., they have the same energy. The $m_s=0$ spin state energy level is split from the $m_s=\pm 1$ energy levels by an energy of 2.87 GHz for a zero external magnetic field.

Introducing an external magnetic field with a component along the NV axis lifts the degeneracy of the $m_s=\pm 1$ energy levels, splitting the energy levels $m_s=\pm 1$ by an amount $2g\mu_B Bz$, where g is the g-factor, $\mu_B$ is the Bohr magneton, and Bz is the component of the external magnetic field along the NV axis. This relationship is correct for a first order and inclusion of higher order corrections is a straight forward matter and will not affect the computational and logic steps in the systems and methods described below.

The NV center electronic structure further includes an excited triplet state $^3E$ with corresponding $m_s=0$ and $m_s=\pm 1$ spin states. The optical transitions between the ground state $^3A_2$ and the excited triplet $^3E$ are spin conserving, meaning that the optical transitions are between initial and final states which have the same spin. For a direct transition between the excited triplet $^3E$ and the ground state $^3A_2$, a photon of red light is emitted with a photon energy corresponding to the energy difference between the energy levels of the transitions.

There is, however, an alternate non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spin states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state. This is so because the decay via the intermediate states does not result in a photon emitted in the fluorescence band, and because of the greater probability that the $m_s=\pm 1$ states of the excited triplet $^3E$ state will decay via the non-radiative decay path. The lower fluorescence intensity for the $m_s=\pm 1$ states than for the $m_s=0$ spin state allows the fluorescence intensity to be used to determine the spin state. As the population of the $m_s=\pm 1$ states increases relative to the $m_s=0$ spin, the overall fluorescence intensity will be reduced.

NV Center, or Magneto-Optical Defect Center, Magnetic Sensor System

Figure 3:
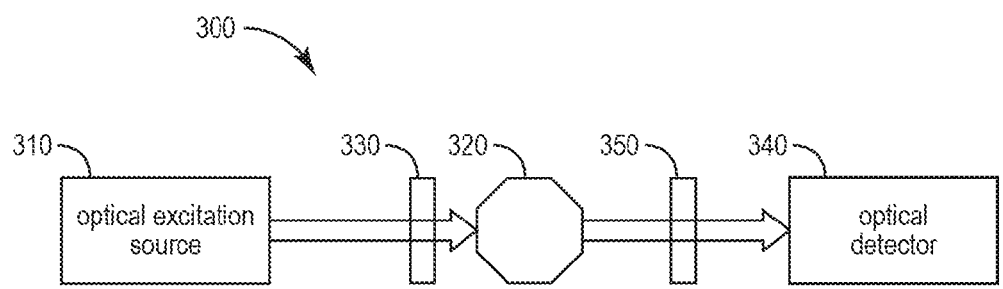
FIG. 3 is a schematic illustrating a NV center magnetic sensor system.

FIG. 3 is a schematic illustrating a NV center magnetic sensor system 300 which uses fluorescence intensity to distinguish the $m_s=\pm 1$ states, and to measure the magnetic field based on the energy difference between the $m_s=+1$ state and the $m_s=-1$ state. The system 300 includes an optical excitation source 310, which directs optical excitation to a NV diamond material 320 with NV centers. The system 300 further includes an RF excitation source 330 which provides RF radiation to the NV diamond material 320. Light from the NV diamond may be directed through an optical filter 350 to an optical detector 340.

The RF excitation source 330 may be a microwave coil, for example. The RF excitation source 330 when emitting RF radiation with a photon energy resonant with the transition energy between ground $m_s=0$ spin state and the $m_s=+1$ spin state excites a transition between those spin states. For such a resonance, the spin state cycles between ground $m_s=0$ spin state and the $m_s=+1$ spin state, reducing the population in the $m_s=0$ spin state and reducing the overall fluorescence at resonance. Similarly resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state. At resonance between the $m_s=0$ spin state and the $m_s=-1$ spin state, or between the $m_s=0$ spin state and the $m_s=+1$ spin state, there is a decrease in the fluorescence intensity.

The optical excitation source 310 may be a laser or a light emitting diode, for example, which emits light in the green, for example. The optical excitation source 310 induces fluorescence in the red, which corresponds to an electronic transition from the excited state to the ground state. Light from the NV diamond material 320 is directed through the optical filter 350 to filter out light in the excitation band (in the green for example), and to pass light in the red fluorescence band, which in turn is detected by the detector 340. The optical excitation light source 310, in addition to exciting fluorescence in the diamond material 320, also serves to reset the population of the $m_s=0$ spin state of the ground state $^3A_2$ to a maximum polarization, or other desired polarization.

Figure 4:
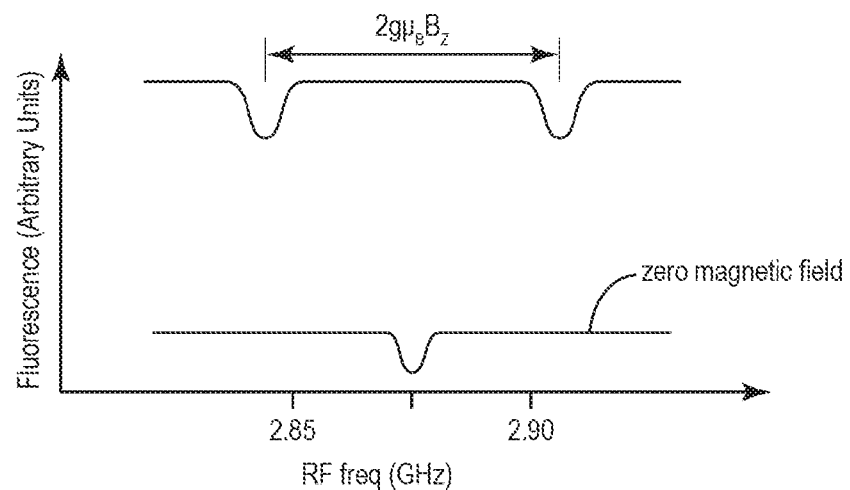
FIG. 4 is a graph illustrating the fluorescence as a function of applied RF frequency of an NV center along a given direction for a zero magnetic field and a non-zero magnetic field.

For continuous wave excitation, the optical excitation source 310 continuously pumps the NV centers, and the RF excitation source 330 sweeps across a frequency range which includes the zero splitting (when the $m_s=\pm 1$ spin states have the same energy) photon energy of 2.87 GHz. The fluorescence for an RF sweep corresponding to a diamond material 320 with NV centers aligned along a single direction is shown in FIG. 4 for different magnetic field components Bz along the NV axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples, of pulsed excitation schemes include Ramsey pulse sequence, and spin echo pulse sequence.

Figure 5:
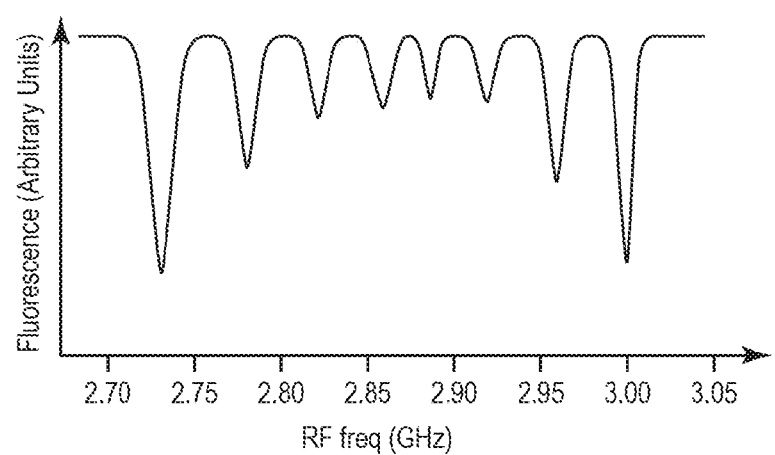
FIG. 5 is a graph illustrating the fluorescence as a function of applied RF frequency for four different NV center orientations for a non-zero magnetic field.

In general, the diamond material 320 will have NV centers aligned along directions of four different orientation classes. FIG. 5 illustrates fluorescence as a function of RF frequency for the case where the diamond material 320 has NV centers aligned along directions of four different orientation classes. In this case, the component Bz along each of the different orientations may be determined. These results along with the known orientation of crystallographic planes of a diamond lattice allow not only the magnitude of the external magnetic field to be determined, but also the direction of the magnetic field.

While FIG. 3 illustrates an NV center magnetic sensor system 300 with NV diamond material 320 with a plurality of NV centers, in general the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material.

Figure 6:
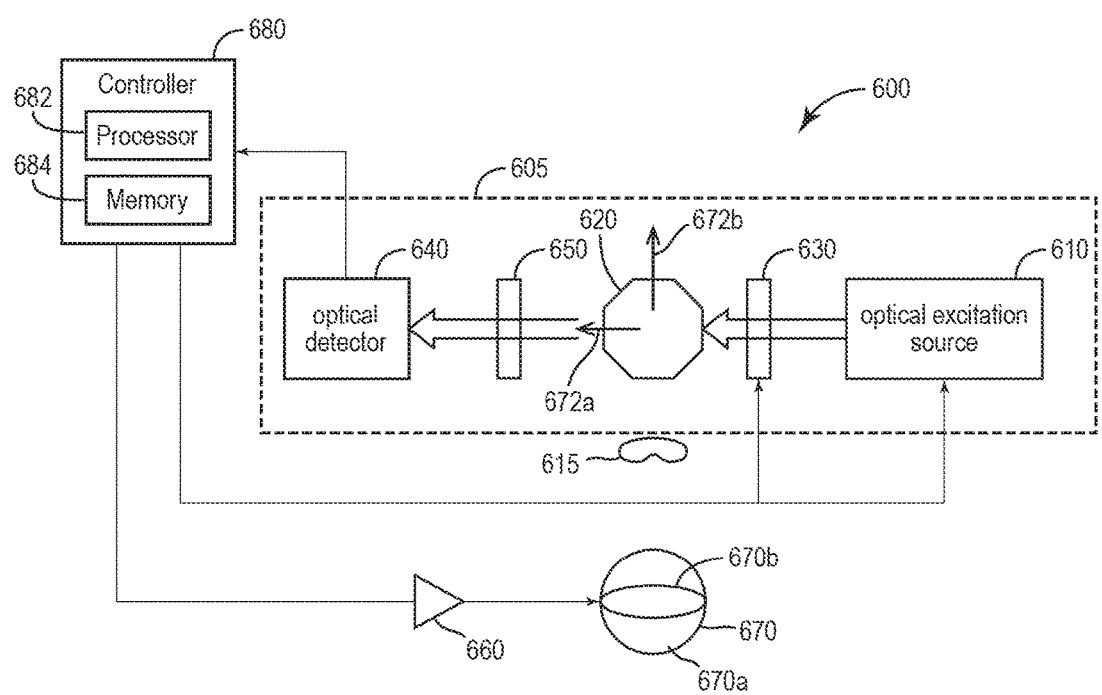
FIG. 6 is a schematic illustrating a system for AC magnetic vector anomaly detection according to an embodiment of the invention.

FIG. 6 is a schematic of a system 600 for AC magnetic vector anomaly detection, according to an embodiment of the invention. The system 600 includes an optical excitation source 610, which directs optical excitation to an NV diamond material 620 with NV centers, or another magneto-optical defect center material with magneto-optical defect centers. An RF excitation source 630 provides RF radiation to the NV diamond material 620. A magnetic field generator 670 generates a magnetic field, which is detected at the NV diamond material 620.

The magnetic field generator 670 may generate magnetic fields with orthogonal polarizations, for example. In this regard, the magnetic field generator 670 may include two or more magnetic field generators, such as including a first magnetic field generator 670a and a second magnetic field generator 670b. Both the first and second magnetic field generators 670a and 670b may be Helmholtz coils, for example. The first magnetic field generator 670a may be arranged to provide a magnetic field which has a first direction 672a at the NV diamond material 620. The second magnetic field generator 670b may be arranged to provide a magnetic field which has a second direction 672b at the NV diamond material 620. Preferably, both the first magnetic field generator 670a and the second magnetic field generator 670b provide relatively uniform magnetic fields at the NV diamond material 620. The second direction 672b may be orthogonal to the first direction 672a, for example. The system 600 may be arranged such that an object 615 is disposed between the magnetic field generator 670 and the NV diamond material 620.

The two or more magnetic field generators of the magnetic field generator 670 may disposed at the same position, or may be separated from each other. In the case that the two or more magnetic field generators are separated from each other, the two or more magnetic field generators may be arranged in an array, such as a one-dimensional or two-dimensional array, for example.

The system 600 may be arranged to include one or more optical detection systems 605, where each of the optical detection systems 605 includes the optical detector 640, optical excitation source 610 and NV diamond material 620. Furthermore, the two or more magnetic field generators of the magnetic field generator 670 may have a relatively high power as compared to the optical detection systems 605. In this way, the optical systems 605, may be deployed in an environment which requires a relatively lower power for the optical systems 605, while the magnetic field generator 670 may be deployed in an environment which has a relatively high power available for the magnetic field generator 670 so as to apply a relatively strong magnetic field.

The system 600 further includes a controller 680 arranged to receive a light detection signal from the optical detector 640 and to control the optical excitation source 610, the RF excitation source 630 and the magnetic field generator 670. The controller may be a single controller, or multiple controllers. For a controller including multiple controllers, each of the controllers may perform different functions, such as controlling different components of the system 600. The magnetic field generator 670 may be controlled by the controller 680 via an amplifier 660, for example.

The RF excitation source 630 may be a microwave coil, for example. The RF excitation source 630 is controlled to emit RF radiation with a photon energy resonant with the transition energy between the ground $m_s=0$ spin state and the $m_s=\pm 1$ spin states as discussed above with respect to FIG. 3.

The optical excitation source 610 may be a laser or a light emitting diode, for example, which emits light in the green, for example. The optical excitation source 610 induces fluorescence in the red from the NV diamond material 620, where the fluorescence corresponds to an electronic transition from the excited state to the ground state. Light from the NV diamond material 620 is directed through the optical filter 650 to filter out light in the excitation band (in the green for example), and to pass light in the red fluorescence band, which in turn is detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610, the RF excitation source 630 and the magnetic field generator 670. The controller may include a processor 682 and a memory 684, in order to control the operation of the optical excitation source 610, the RF excitation source 630 and the magnetic field generator 670. The memory 684, which may include a nontransitory computer readable medium, may store instructions to allow the operation of the optical excitation source 610, the RF excitation source 630 and the magnetic field generator 670 to be controlled. That is, the controller 680 may be programmed to provide control.

ODMR Detection of Magnetic Fields

Figure 7:
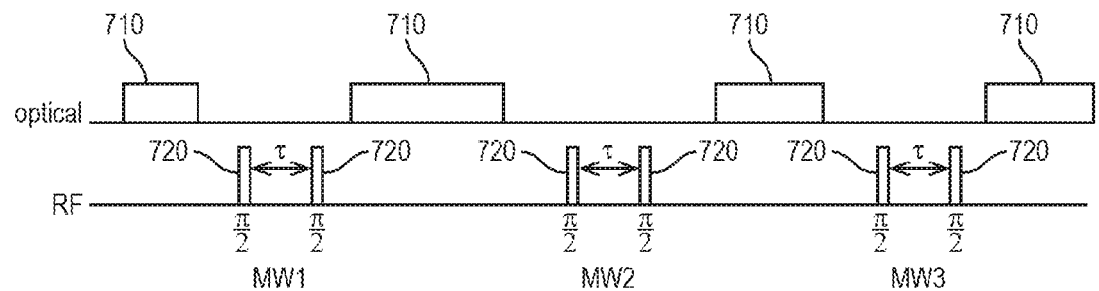
FIG. 7 is a schematic illustrating a sequence of optical excitation pulses and RF pulses according to the operation of the system of FIG. 6.

According to one embodiment of operation, the controller 680 controls the operation of the optical excitation source 610, the RF excitation source 630 and the magnetic field generator 670 to perform Optically Detected Magnetic Resonance (ODMR). The component of the magnetic field Bz along the NV axis of NV centers aligned along directions of four different orientation classes of the NV centers may be determined by ODMR, for example, by using an ODMR pulse sequence according to a Ramsey pulse scheme, as shown in FIG. 7. FIG. 7 illustrates the sequence of optical excitation pulses 710 provided by the optical excitation source 610, and the microwave (MW) pulses 720 provided by the RF excitation source 630. In between each optical pulse 710, two MW pulses 720, separated by a time τ, and at a given RF frequency are provided. For ease of understanding, three MW pulses 720 with three different frequencies, MW1, MW2 and MW3, are shown in FIG. 7, although a larger number of RF frequencies may be employed. The three different frequencies, MW1, MW2 and MW3, respectively correspond to three different NV center orientations. This allows for the determination of the spatial orientation of the channels detected.

Figure 8:
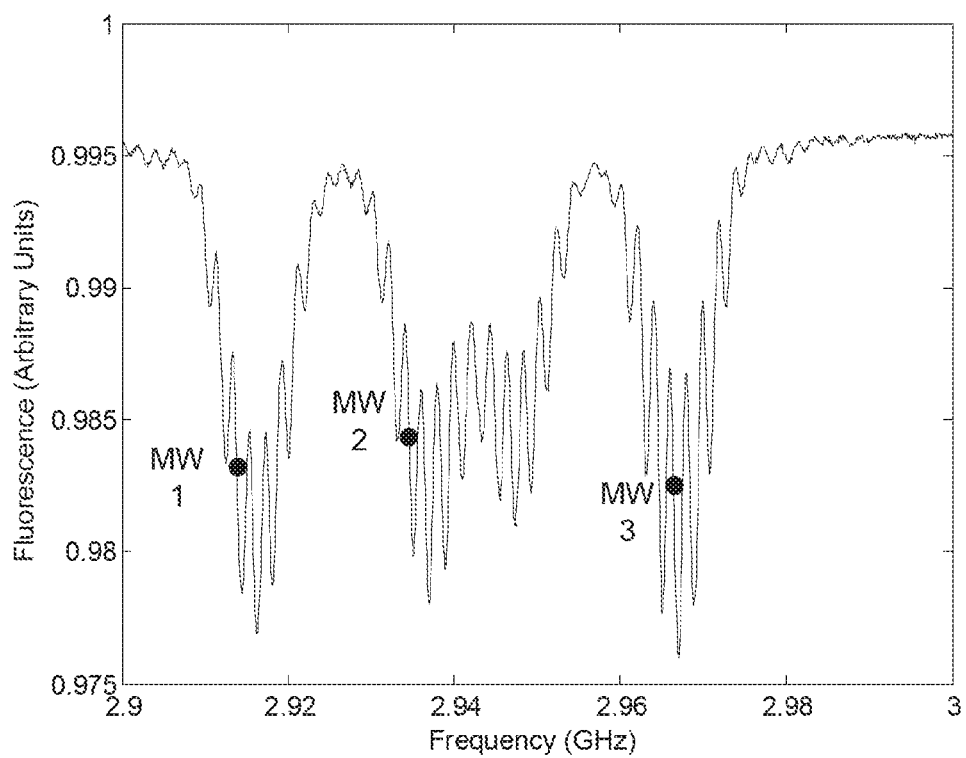
FIG. 8 is a graph illustrating the fluorescence signal of NV diamond material as a function of RF excitation frequency over a range of RF frequencies according to an embodiment of the invention.

FIG. 8 illustrates the fluorescence signal of the diamond material 620 detected as a function of RF frequency over the range from 2.9 to 3.0 GHz. FIG. 8 shows three dips in fluorescence, where the microwave frequencies corresponding to MW1, MW2 and MW3 are shown in the corresponding dips. The dips respectively correspond to the magnetic field components along the NV axis for three diamond lattice directions. FIG. 8 illustrates the dips in fluorescence only for RF frequencies above the zero magnetic field 2.87 GHz line (where there is no splitting of the $m_s=\pm 1$ spin states), while in general there will also be three corresponding dips below the 2.87 GHz line. The three dips in fluorescence above the zero magnetic field 2.87 GHz line correspond to the $m_s=+1$ spin state, while the three dips in fluorescence below the zero magnetic field 2.87 GHz line correspond to the $m_s=-1$ spin state. As discussed above, the difference in photon energies between the corresponding dips is given by 2 $g\mu_B Bz$, where g is the g-factor, $\mu_B$ is the Bohr magneton, and Bz is the component of the external magnetic field along the NV axis, and thus Bz for each of three diamond lattice directions may be determined. While FIG. 8 illustrates the dips in fluorescence respectively corresponding to three diamond lattice directions, four diamond lattice directions may be used instead, for example. The magnetic field vector, including magnitude and direction, may then be determined based on Bz components along different lattice directions.

The system 600 may transmit code packets from the magnetic field generator 670 to the NV diamond material 620 by modulating code by controlling the magnetic field generator 670. The transmitted code packet may then be demodulated. Transmitted code packets may be transmitted along two or more channels, such as two channels where one channel is based on a magnetic field generated by the first magnetic field generator 670a, and a second channel is based on a magnetic field generated by the second magnetic field generator 670b. The magnetic fields generated by the first and second magnetic field generators 670a and 670b may be orthogonal to each other at the NV diamond material 620 in the absence of any present material where the present material alters the magnetic field which is generated by the magnetic field generators 670a and 670b and detected by the NV diamond material 620. It should be noted that the present material need not be between the magnetic field generators 670a and 670b and the NV diamond material 620.

The code packets, which may include a binary sequence, are modulated by the processor 680, which controls the magnetic field generator 670 to generate a time varying magnetic field, and transmits the code packets to the NV diamond material 620. Specifically, the processor 680 modulates a different correlated code, such as gold codes, for each channel, where the correlated codes for the different channels are binary sequences which are optimized for a low cross correlation (between different correlation codes), and have a good autocorrelation. In the case of two channels, the processor 680 may control the first magnetic field generator 670a to transmit a first correlated code, and further control the second magnetic field generator 670b to transmit a second correlated code. Thus, the correlated code packets are transmitted via two channels, one for the first correlated code via the first magnetic field generator 670a, and the other for the second correlated code via the second magnetic field generator 670b. The correlated codes may be modulated by continuous phase modulation, and may be modulated by MSK frequency modulation, for example.

The transmission of code packets using correlated codes may provide gain as compared to simple DC transmission. In particular, longer codes provide an increased gain, but require a longer time for transmission.

Figure 9A:
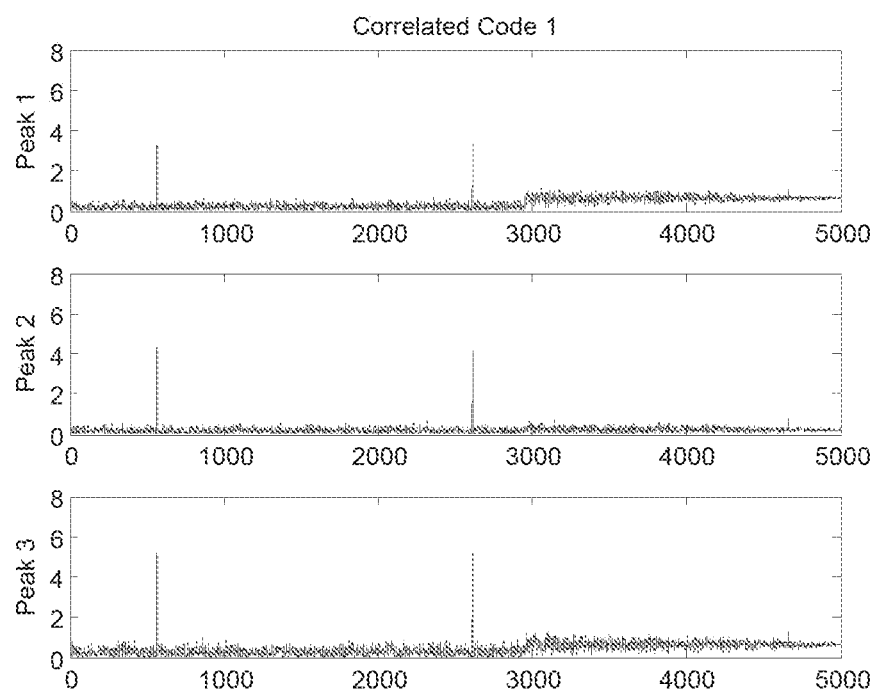
FIG. 9A illustrates a matched-filtered first correlated code for the magnetic field component along three different diamond lattice directions corresponding to the magnetic field provided by a first magnetic field generator according to an embodiment of the invention.
Figure 9B:
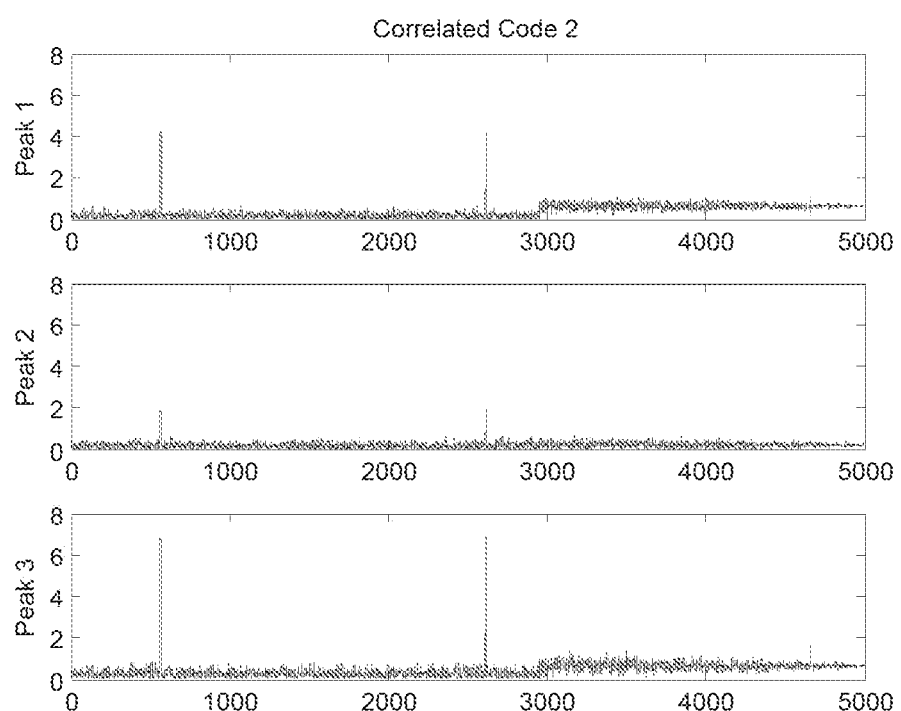
FIG. 9B illustrates a matched-filtered first correlated code for the magnetic field component along three different diamond lattice directions corresponding to the magnetic field provided by a second magnetic field generator according to an embodiment of the invention.

The modulated code packets transmitted by the magnetic field generator 670 are then detected using ODMR techniques as described above, and demodulated. The processor 680 demodulates the correlated code packets by using a matched filter. The matched filter correlates with the transmitted correlated codes for each channel, and for each magnetic field projection along a lattice direction. It should be noted that the modulation for the different channels may be performed simultaneously. Likewise, the demodulation for the different channels may be performed simultaneously. FIG. 9A illustrates a match-filtered first correlated code for the magnetic field component along three lattice directions corresponding to the magnetic field provided by the first magnetic field generator 670a, while FIG. 9B illustrates a match-filtered second correlated code for the magnetic field component along three lattice directions corresponding to the magnetic field provided by the second magnetic field generator 670b. The spike shown for each of the three diamond lattice directions corresponds to the projected magnetic field along a respective of the three lattice directions. The magnetic field vector, including both magnitude and direction, may then be reconstructed based on the projected magnetic fields along the three lattice directions.

Figure 10:
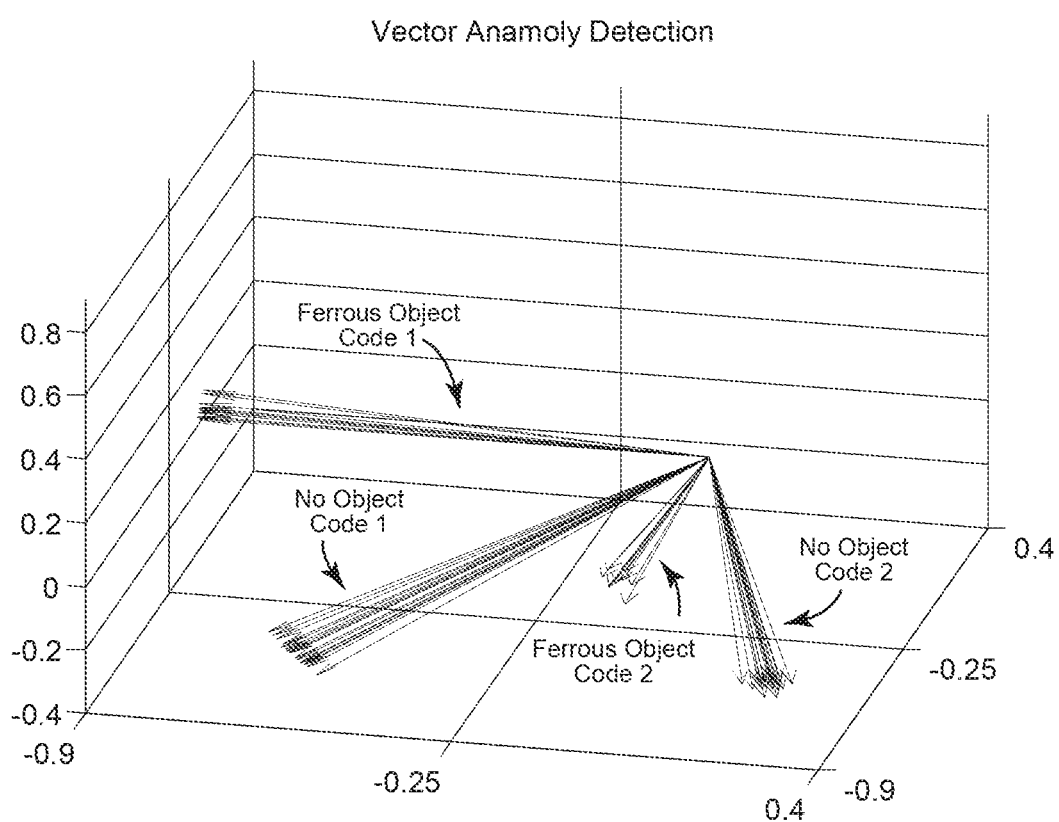
FIG. 10 illustrates reconstructed magnetic field vectors for two different correlated codes in the case where a ferrous object and no object are disposed in relation to a magnetic field generator and NV diamond material, according to an embodiment of the invention.

If there is an object 615 present which affects the magnetic field generated by the magnetic field generator 670 where the magnetic field is felt by the NV diamond material 620, the magnetic field vector detected at the NV diamond material 620 will change. FIG. 10 illustrates the reconstructed magnetic field vector for two correlated codes for the case where an object 615 is disposed between the magnetic field generator 670 and the NV diamond material 620, in the case where the first correlated code is transmitted via the first magnetic field generator 670a, and the second correlated code is transmitted via the second magnetic field generator 670b. FIG. 10 illustrates both the case where the object 615 is a ferrous object and where no object 615 is present.

For a ferrous object, however, the reconstructed magnetic field vector for first correlated code rotates about 46° relative to that for no object, while the second correlated code rotates about 28° relative to that for no object. That is, the ferrous object affects the magnetic field at the NV diamond material 620 applied by first magnetic field generator 670a more than the magnetic field at the NV diamond material 620 applied by second magnetic field generator 670b. This result provides two insights, first, the system 600 may detect magnetic anomalies due to a ferrous object affecting the magnetic field felt by the NV diamond material 620 which is generated by the magnetic field generator 670 acting as a transmitter, and second, two different channels, providing orthogonal probing magnetic fields, may be applied simultaneously, thus providing an increase in the magnetic parameters probed. The reconstructed magnetic field vector, in addition to changing direction due to the presences of a ferrous object, may also change in magnitude. The AC nature of the ODMR technique employed reduces DC bias.

Frequency Based Detection

The present system allows for frequency based detection based on frequency dependent attenuation in the magnetic field provided by the magnetic field generator 670. While FIG. 10 illustrates magnetic anomaly detection of a ferrous object, a non-ferrous object may also be detected, such as an object formed of an electrically conductive material. For example, if the non-ferrous object provides for a frequency dependent attenuation in the magnetic field provided by the magnetic field generator 670, the non-ferrous object may be detected.

While frequency based detection may allow for a greater range of objects detected, the frequency based detection may further allow for operation in a less noisy environment. In this case, the frequency range is set to a range with less noise.

Magnetic Anomaly Detection

The system 600 for AC magnetic vector anomaly detection may further include a reference library which may be stored in the memory 684 of the controller 680, or stored separately from the memory 684. In either case, the reference library is accessible to the processor 682. The reference library contains reference magnetic field vectors corresponding to different objects. The reference library contains a reference magnetic field vector both for the first correlation code, corresponding to the magnetic field generated by the first magnetic field generator 670a, and the second correlation code, corresponding to the magnetic field generated by the second magnetic field generator 670b.

The reference magnetic field vectors for the first correlation code and the second correlation code from the reference library may be compared to the reconstructed magnetic field vectors as determined by the system 600. An object may be identified based on a match between the reference magnetic field vectors from the reference library and the reconstructed magnetic field vectors as determined by the system 600. Using two or more correlation codes, corresponding to different, preferably orthogonal, polarizations of the magnetic field applied to the NV diamond material 620, provides increased accuracy in identification of an object because a match for both polarizations is needed for identification.

As discussed above, providing improved magnetic anomaly detection may be accomplished by incorporating a magnetic field generator which generates two or more separate magnetic fields at the NV diamond material, or other magneto-optical material, where the magnetic fields may be orthogonal to each other. The magnetic fields may generated in two or more different channels, where the effect on the magnetic field due to a nearby magnetic object in the two different channels provides an increased number of magnetic parameters, which enhances the identification of the object.

Applying the magnetic field for the different channels can be accomplished by modulating the magnetic field applied and transmission of correlation code packets, followed by detection and demodulation of the code packets. The different correlation codes for the different channels are binary sequences which have a small cross correlation. The correlation code packets may be demodulated using matched filtering providing magnetic field components along different diamond lattice directions. A magnetic vector may then be reconstructed using the magnetic field components, providing a reconstructed magnetic field vector for the different channels. The reconstructed magnetic field vectors of each of the channels may be compared to reference magnetic field vectors corresponding to objects with different magnetic material profiles to identify the object.

The embodiments of the inventive concepts disclosed herein have been described in detail with particular reference to preferred embodiments thereof, but it will be understood by those skilled in the art that variations and modifications can be effected within the spirit and scope of the inventive concepts.

What is claimed is:

1. A system for magnetic detection, comprising:
 a magneto-optical defect center material comprising a plurality of magneto-optical defect centers;
 a magnetic field generator configured to generate a magnetic field;
 a radio frequency (RF) excitation source configured to provide RF excitation to the magneto-optical defect center material;
 an optical excitation source configured to provide optical excitation to the magneto-optical defect center material;
 an optical detector configured to receive an optical signal emitted by the magneto-optical defect center material; and
 a controller configured to:
 control the magnetic field generator to apply a time varying magnetic field at the magneto-optical defect center material,
 determine a magnitude and direction of the magnetic field at the magneto-optical defect center material based on a received light detection signal from the optical detector, and
 determine a magnetic vector anomaly due to an object based on the determined magnitude and direction of the magnetic field according to a frequency dependent attenuation of the time varying magnetic field.

2. The system of claim 1, wherein the object is ferrous.

3. The system of claim 1, wherein the object is non-ferrous.

4. A system for magnetic detection, comprising:
 a nitrogen vacancy (NV) diamond material comprising a plurality of NV centers;
 a magnetic field generator comprising at least two magnetic field generators including a first magnetic field generator configured to generate a first magnetic field and a second magnetic field generator configured to generate a second magnetic field;
 a radio frequency (RF) excitation source configured to provide RF excitation to the NV diamond material;
 an optical excitation source configured to provide optical excitation to the NV diamond material;
 an optical detector configured to receive an optical signal emitted by the NV diamond material; and
 a controller configured to:
 modulate a first code packet and control the first magnetic field generator to apply a first time varying magnetic field at the NV diamond material based on the modulated first code packet,
 modulate a second code packet and control the second magnetic field generator to apply a second time varying magnetic field at the NV diamond material based on the modulated second code packet, wherein the first code packet and the second code packet are binary sequences which have a low cross correlation with each other, and each of the binary sequences has a good autocorrelation.

5. The system of claim 4, wherein a direction of the first time varying magnetic field at the NV diamond material is different from a direction of the second time varying magnetic field at the NV diamond material.

6. The system of claim 4, wherein the controller is further configure to:
receive first light detection signals from the optical detector based on the optical signal emitted by the NV diamond material based on the first code packet transmitted to the NV diamond material, and receive second light detection signals from the optical detector based on the optical signal emitted by the NV diamond material based on the second code packet transmitted to the NV diamond material simultaneous with the first code packet being transmitted to the NV diamond material;
apply matched filters to the received first and second light detection signals to demodulate the first and second code packets,
determine a magnitude and direction of the first magnetic field and the second magnetic field at the NV diamond material based on the demodulated first and second code packets; and
determine a magnetic vector anomaly based on the determined magnitude and direction of the first magnetic field and the second magnetic field.

7. The system of claim 4, wherein the first and second code packets are modulated by continuous phase modulation.

8. The system of claim 4, wherein the first and second code packets are modulated by MSK frequency modulation.

9. A system for magnetic detection, comprising:
a magneto-optical defect center material comprising a plurality of magneto-optical defect centers;
a magnetic field generator configured to generate a magnetic field;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material; and
a controller configured to:
control the magnetic field generator to apply a time varying magnetic field at the magneto-optical defect center material,
determine a magnitude and direction of the magnetic field at the magneto-optical defect center material based on a received light detection signal from the optical detector, and
determine a magnetic vector anomaly based on the determined magnitude and direction of the magnetic field.

10. The system of claim 9, wherein the magnetic field generator comprising two or more magnetic field generators including a first magnetic field generator configured to generate a first magnetic field at the magneto-optical defect center material in a first direction and a second magnetic field generator configured to generate a second magnetic field at the magneto-optical defect center material in a second direction different from the first direction.

11. The system of claim 10, wherein the first direction is orthogonal to the second direction.

12. The system of claim 10, wherein the controller is configured to:
modulate a first code packet and control the first magnetic field generator to apply a first time varying magnetic field at the magneto-optical defect center material based on the modulated first code packet, and
modulate a second code packet and control the second magnetic field generator to apply a second time varying magnetic field at the magneto-optical defect center material based on the modulated second code packet, wherein the first code packet and the second code packet are binary sequences which have a low cross correlation with each other, and each of the binary sequences has a good autocorrelation.

13. A system for magnetic detection, comprising:
a magneto-optical defect center material comprising a plurality of magneto-optical defect centers;
a magnetic field generator comprising two or more magnetic field generators including a first magnetic field generator configured to generate a first magnetic field and a second magnetic field generator configured to generate a second magnetic field;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material; and
a controller configured to:
control the first magnetic field generator to apply a first time varying magnetic field at the magneto-optical defect center material,
control the second magnetic field generator to apply a second time varying magnetic field at the magneto-optical defect center material, wherein a direction of the first time varying magnetic field at the magneto-optical defect center material is different from a direction of the second time varying magnetic field at the magneto-optical defect center material,
determine a magnitude and direction of the first magnetic field and the second magnetic field at the magneto-optical defect center material based on the received light detection signal from the optical detector; and
determine a magnetic vector anomaly based on the determined magnitude and direction of the first magnetic field and the second magnetic field.

14. The system of claim 13, wherein the direction of the first magnetic field at the magneto-optical defect center material is orthogonal to the direction of the second magnetic field at the magneto-optical defect center material.

15. The system of claim 13, wherein the controller is configured to control the RF excitation source and the optical excitation source to provide a sequence of pulses to the magneto-optical defect center material.

16. The system of claim 15, wherein the sequence of pulses is a Ramsey sequence.

17. The system of claim 13, wherein the controller is configured to:
modulate a first code packet and control the first magnetic field generator to apply a first time varying magnetic field at the magneto-optical defect center material based on the modulated first code packet, and modulate a second code packet and control the second magnetic field generator to apply a second time varying magnetic field at the magneto-optical defect center material based on the modulated second code packet, wherein the first code packet and the second code packet are binary sequences which have a low cross correlation with each other, and each of the binary sequences has as good autocorrelation.

18. A system for magnetic detection, comprising:
a nitrogen vacancy (NV) diamond material comprising a plurality of NV centers;
a magnetic field generator configured to generate a magnetic field;
a radio frequency (RF) excitation source configured to provide RF excitation to the NV diamond material;
an optical excitation source configured to provide optical excitation to the NV diamond material;
an optical detector configured to receive an optical signal emitted by the NV diamond material; and
a controller configured to:
control the magnetic field generator to apply a first magnetic field at the NV diamond material and to apply a second magnetic field at the NV diamond material having a direction different from the first magnetic field;
control the RF excitation source and the optical excitation source to provide a sequence of pulses to the NV diamond material;
receive a light detection signal from the optical detector based on the optical signal emitted by the NV diamond material based on the sequence of pulses;
determine a magnitude and direction of the first magnetic field and the second magnetic field at the NV diamond material based on the received light detection signal from the optical detector; and
determine a magnetic vector anomaly based on the determined magnitude and direction of the first magnetic field and the second magnetic field.

19. The system of claim 18, wherein a direction of the first magnetic field at the NV diamond material is orthogonal to a direction of the second magnetic field at the NV diamond material.

20. The system of claim 18, wherein the sequence of pulses is a Ramsey sequence.

21. The system of claim 18, wherein the controller is configured to:
modulate a first code packet and control the first magnetic field generator to apply a first time varying magnetic field at the NV diamond material based on the modulated first code packet, and
modulate a second code packet and control the second magnetic field generator to apply a second time varying magnetic field at the NV diamond material based on the modulated second code packet, wherein the first code packet and the second code packet are binary sequences which have a low cross correlation with each other, and each of the binary sequences has as good autocorrelation.

22. The system of claim 18, wherein the controller is further configured to identify an object corresponding to the magnetic vector anomaly.

23. A system for magnetic detection, comprising:
a nitrogen vacancy (NV) diamond material comprising a plurality of NV centers;
a magnetic field generator configured to generate a magnetic field;
a radio frequency (RF) excitation source configured to provide RF excitation to the NV diamond material;
an optical excitation source configured to provide optical excitation to the NV diamond material;
an optical detector configured to receive an optical signal emitted by the NV diamond material; and
a control unit for:
controlling the magnetic field generator to apply a time varying magnetic field at the NV diamond material;
determining a magnitude and direction of the magnetic field at the NV diamond material based on a received light detection signal from the optical detector; and
determining a magnetic vector anomaly based on the determined magnitude and direction of the magnetic field.

24. The system of claim 23, wherein the controller is further configured to identify an object corresponding to the magnetic vector anomaly.

25. The system of claim 24, wherein the controller is further configured to identify an object corresponding to the magnetic vector anomaly based on comparing the determined magnetic vector anomaly with magnetic vector anomalies stored in a reference library.

26. A system for magnetic detection, comprising:
a magneto-optical defect center material;
a magnetic field generator comprising at least two magnetic field generators including at least two magnetic field generators including a first magnetic field generator configured to generate a first magnetic field and a second magnetic field generator configured to generate a second magnetic field;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material; and
a controller configured to:
modulate a first code packet and control the first magnetic field generator to apply a first time varying magnetic field at the magneto-optical defect center material based on the modulated first code packet,
modulate a second code packet and control the second magnetic field generator to apply a second time varying magnetic field at the magneto-optical defect center material based on the modulated second code packet, wherein the first code packet and the second code packet are binary sequences which have a low cross correlation with each other, and each of the binary sequences has as good autocorrelation.

27. The system of claim 26, wherein a direction of the first time varying magnetic field at the magneto-optical defect center material is different from a direction of the second time varying magnetic field at the magneto-optical defect center material.

28. The system of claim 26, wherein the controller is further configure to:
receive first light detection signals from the optical detector based on the optical signal emitted by the magneto-optical defect center material based on the first code packet transmitted to the magneto-optical defect center material, and receive second light detection signals from the optical detector based on the optical signal emitted by the magneto-optical defect center material based on the second code packet transmitted to the magneto-optical defect center material simultaneous with the first code packet being transmitted to the magneto-optical defect center material;
apply matched filters to the received first and second light detection signals to demodulate the first and second code packets,
determine a magnitude and direction of the first magnetic field and the second magnetic field at the magneto-optical defect center material based on the demodulated first and second code packets; and
determine a magnetic vector anomaly based on the determined magnitude and direction of the first magnetic field and the second magnetic field.

29. The system of claim 26, wherein the first and second code packets are modulated by continuous phase modulation.

30. The system of claim 26, wherein the first and second code packets are modulated by MSK frequency modulation.

31. A system for magnetic detection, comprising:
a magneto-optical defect center material;
a magnetic field generator configured to generate a magnetic field;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material; and
a controller configured to:
control the magnetic field generator to apply a first magnetic field at the magneto-optical defect center material and to apply a second magnetic field at the magneto-optical defect center material having a direction different from the first magnetic field;
control the RF excitation source and the optical excitation source to provide a sequence of pulses to the magneto-optical defect center material;
receive a light detection signal from the optical detector based on the optical signal emitted by the magneto-optical defect center material based on the sequence of pulses;
determine a magnitude and direction of the first magnetic field and the second magnetic field at the magneto-optical defect center material based on the received light detection signal from the optical detector; and
determine a magnetic vector anomaly based on the determined magnitude and direction of the first magnetic field and the second magnetic field.

32. A system for magnetic detection, comprising:
a magneto-optical defect center material;
a magnetic field generator configured to generate a magnetic field;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material; and
a controller configured to:
control the magnetic field generator to apply a time varying magnetic field at the magneto-optical defect center material;
determine a magnitude and direction of the magnetic field at the magneto-optical defect center material based on a received light detection signal from the optical detector; and
determine a magnetic vector anomaly based on the determined magnitude and direction of the magnetic field.

33. A system for magnetic detection, comprising:
a magneto-optical defect center material comprising a plurality of magneto-optical defect centers;
a magnetic field generator means comprising at least two magnetic field generators including a first magnetic field generator means configured for generating a first magnetic field and a second magnetic field generator mean for generating a second magnetic field;
a radio frequency (RF) excitation means for providing RF excitation to the magneto-optical defect center material;
an optical excitation means for providing optical excitation to the magneto-optical defect center material;
an optical detection means for receiving an optical signal emitted by the magneto-optical defect center material; and
a control means for:
modulating a first code packet and controlling the first magnetic field generator means to apply a first time varying magnetic field at the magneto-optical defect center material based on the modulated first code packet,
modulating a second code packet and controlling the second magnetic field generator means to apply a second time varying magnetic field at the magneto-optical defect center material, simultaneous with the first time varying magnetic field being applied at the magneto-optical defect center material, based on the modulated second code packet, wherein the first code packet and the second code packet are binary sequences which have a low cross correlation with each other, and each of the binary sequences has a good autocorrelation.

34. The system of claim 33, wherein a direction of the first time varying magnetic field at the magneto-optical defect center material is different from a direction of the second time varying magnetic field at the magneto-optical defect center material.

35. The system of claim 33, wherein the control means is further for:
receiving first light detection signals from the optical detection means based on the optical signal emitted by the magneto-optical defect center material based on the first code packet transmitted to the magneto-optical defect center material, and receiving second light detection signals from the optical detection means based on the optical signal emitted by the magneto-optical defect center material based on the second code packet transmitted to the magneto-optical defect center material simultaneous with the first code packet transmitted to the magneto-optical defect center material;
applying matched filters to the received first and second light detection signals to demodulate the first and second code packets,
determining a magnitude and direction of the first magnetic field and the second magnetic field at the magneto-optical defect center material based on the demodulated first and second code packets; and determining a magnetic vector anomaly based on the determined magnitude and direction of the first magnetic field and the second magnetic field.

36. The system of claim 33, wherein the first and second code packets are modulated by continuous phase modulation.

37. The system of claim 33, wherein the first and second code packets are modulated by MSK frequency modulation.

38. A system for magnetic detection, comprising:
a magneto-optical defect center material comprising a plurality of magneto-optical defect centers;
a magnetic field generator means for generating a magnetic field;
a radio frequency (RF) excitation means for providing RF excitation to the magneto-optical defect center material;
an optical excitation means for providing optical excitation to the magneto-optical defect center material;
an optical detection means for receiving an optical signal emitted by the magneto-optical defect center material; and
a control means for:
controlling the magnetic field generator means to apply a first magnetic field at the magneto-optical defect center material and to apply a second magnetic field at the magneto-optical defect center material having a direction different from the first magnetic field;
controlling the RF excitation means and the optical excitation means to provide a sequence of pulses to the magneto-optical defect center material;
receiving a light detection signal from the optical detection means based on the optical signal emitted by the magneto-optical defect center material based on the sequence of pulses;
determining a magnitude and direction of the first magnetic field and the second magnetic field at the magneto-optical defect center material based on the received light detection signal from the optical detection means; and
determining a magnetic vector anomaly based on the determined magnitude and direction of the first magnetic field and the second magnetic field.

39. A system for magnetic detection, comprising:
a magneto-optical defect center material comprising a plurality of magneto-optical defect centers;
a magnetic field generator means for generating a magnetic field;
a radio frequency (RF) excitation means of providing RF excitation to the magneto-optical defect center material;
an optical excitation means of providing optical excitation to the magneto-optical defect center material;
an optical detection means for receiving an optical signal emitted by the magneto-optical defect center material; and
a control means for:
controlling the magnetic field generator means to apply a time varying magnetic field at the magneto-optical defect center material;
determining a magnitude and direction of the magnetic field at the magneto-optical defect center material based on a received light detection signal from the optical detection means; and
determining a magnetic vector anomaly based on the determined magnitude and direction of the magnetic field.

40. The system of claim 1, wherein the magneto-optical defect center material is a nitrogen vacancy diamond material.

41. The system of claim 9, wherein the magneto-optical defect center material is a nitrogen vacancy diamond material.

42. The system of claim 33, wherein the magneto-optical defect center material is a nitrogen vacancy diamond material.

43. The system of claim 38, wherein the magneto-optical defect center material is a nitrogen vacancy diamond material.

44. The system of claim 39, wherein the magneto-optical defect center material is a nitrogen vacancy diamond material.

* * * * *